United States Patent
Delfyett et al.

(10) Patent No.: US 7,095,772 B1
(45) Date of Patent: Aug. 22, 2006

(54) EXTREME CHIRPED/STRETCHED PULSED AMPLIFICATION AND LASER

(75) Inventors: Peter J. Delfyett, Geneva, FL (US); Kyungbum Kim, Orlando, FL (US); Bojan Resan, Orlando, FL (US)

(73) Assignee: Research Foundation of the University of Central Florida, Inc., Orlando, FL (US)

( * ) Notice: Subject to any disclaimer, the term of this patent is extended or adjusted under 35 U.S.C. 154(b) by 335 days.

(21) Appl. No.: 10/828,965

(22) Filed: Apr. 21, 2004

Related U.S. Application Data

(60) Provisional application No. 60/472,383, filed on May 22, 2003.

(51) Int. Cl.
  *H01S 3/00* (2006.01)
  *H01S 5/00* (2006.01)
  *H01S 3/09* (2006.01)

(52) U.S. Cl. ............ 372/50.22; 372/21; 372/69; 359/333; 359/334

(58) Field of Classification Search ............ 372/21, 372/39, 43.01, 50.22, 69, 70, 75; 359/333, 359/334
  See application file for complete search history.

(56) References Cited

U.S. PATENT DOCUMENTS

| | | | |
|---|---|---|---|
| 5,499,134 A * | 3/1996 | Galvanauskas et al. ..... 359/333 |
| 5,572,355 A | 11/1996 | Cotton et al. .............. 359/333 |
| 5,633,885 A | 5/1997 | Galvanauskas et al. ....... 372/25 |
| 5,696,782 A * | 12/1997 | Harter et al. ................. 372/25 |
| 5,701,319 A | 12/1997 | Fermann ...................... 372/18 |
| 5,745,284 A * | 4/1998 | Goldberg et al. ........... 359/344 |
| 5,818,630 A | 10/1998 | Fermann et al. ............ 359/341 |
| 5,847,863 A | 12/1998 | Galvanauskas et al. ..... 359/341 |
| 5,862,287 A | 1/1999 | Stock et al. ................. 385/123 |
| 5,880,877 A | 3/1999 | Fermann et al. ............ 359/341 |
| 5,991,479 A * | 11/1999 | Kleinerman ................. 385/31 |
| 6,014,249 A | 1/2000 | Fermann et al. ............ 359/341 |
| 6,154,310 A | 11/2000 | Galvanauskas et al. ..... 359/328 |
| 6,181,463 B1 | 1/2001 | Galvanauskas et al. ..... 359/330 |
| 6,198,568 B1 * | 3/2001 | Galvanauskas et al. ..... 359/332 |
| 6,208,458 B1 | 3/2001 | Galvanauskas et al. ..... 359/345 |
| 6,249,630 B1 | 6/2001 | Stock et al. ................. 385/123 |
| 6,275,512 B1 | 8/2001 | Fermann ........................ 372/6 |
| 6,297,179 B1 * | 10/2001 | Beall et al. ..................... 501/5 |
| 6,334,011 B1 | 12/2001 | Galvanauskas et al. ....... 385/22 |
| 6,345,058 B1 | 2/2002 | Hartemann et al. ............ 372/2 |
| 6,363,090 B1 | 3/2002 | Wintner et al. ............... 372/21 |
| 6,549,547 B1 | 4/2003 | Galvanauskas et al. ....... 372/25 |
| 6,567,430 B1 * | 5/2003 | Islam et al. ..................... 372/3 |
| 6,570,704 B1 * | 5/2003 | Palese ........................ 359/349 |
| 6,590,910 B1 | 7/2003 | Lin ............................... 372/18 |
| 6,603,600 B1 | 8/2003 | Pang .......................... 359/348 |

(Continued)

*Primary Examiner*—Armando Rodriguez
*Assistant Examiner*—Hrayr A. Sayadian
(74) *Attorney, Agent, or Firm*—Brian S. Steinberger; Law Offices of Brian S. Steinberger, P.A.

(57) ABSTRACT

Methods, devices and systems for generating ultrashort optical linear chirped pulses with very high power by amplifying the pulses so that their temporal duration is longer than the storage time of the amplifying medium. The additional gain factor is related to the ratio of the storage time to the stretched pulse. A preferred embodiment connects a mode locked laser source that generates optical pulses whose duration is stretched with a chirped fiber Bragg grating. Embodiments include methods, devices and systems causing an extreme chirped pulse amplifier (XCPA) effect in an oscillator.

31 Claims, 48 Drawing Sheets

U.S. PATENT DOCUMENTS

| | | | |
|---|---|---|---|
| 6,654,161 B1* | 11/2003 | Bass et al. | 359/326 |
| 6,804,045 B1* | 10/2004 | Barty | 359/337 |
| 6,885,683 B1* | 4/2005 | Fermann et al. | 372/25 |
| 6,900,920 B1* | 5/2005 | Chang-Hasnain et al. | 359/244 |
| 6,943,935 B1* | 9/2005 | Bickham et al. | 359/334 |
| 2002/0114030 A1* | 8/2002 | Dwivedi et al. | 359/118 |
| 2003/0156605 A1* | 8/2003 | Richardson et al. | 372/25 |
| 2004/0000942 A1* | 1/2004 | Kapteyn et al. | 327/306 |
| 2004/0036957 A1* | 2/2004 | Galvanauskas et al. | 359/341.3 |
| 2004/0091000 A1* | 5/2004 | Kuksenkov | 372/3 |
| 2004/0196878 A1* | 10/2004 | Arisawa et al. | 372/25 |
| 2004/0263949 A1* | 12/2004 | Gu et al. | 359/333 |
| 2004/0263950 A1* | 12/2004 | Fermann et al. | 359/333 |
| 2005/0041702 A1* | 2/2005 | Fermann et al. | 372/25 |
| 2005/0058462 A1* | 3/2005 | Talebpour et al. | 398/199 |
| 2005/0163426 A1* | 7/2005 | Fermann et al. | 385/37 |
| 2005/0196174 A1* | 9/2005 | Evangelides et al. | 398/151 |
| 2005/0196175 A1* | 9/2005 | Evangelides et al. | 398/151 |
| 2005/0226278 A1* | 10/2005 | Gu et al. | 372/6 |
| 2005/0238070 A1* | 10/2005 | Imeshev et al. | 372/21 |
| 2005/0265407 A1* | 12/2005 | Braun et al. | 372/30 |

* cited by examiner

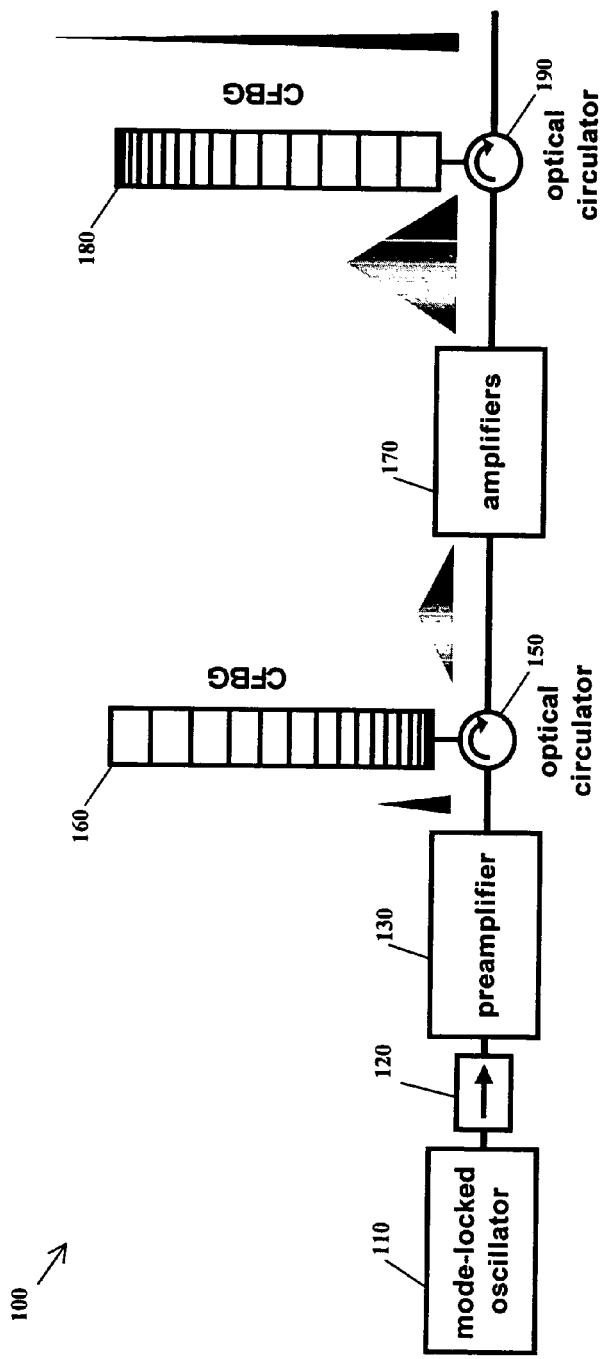
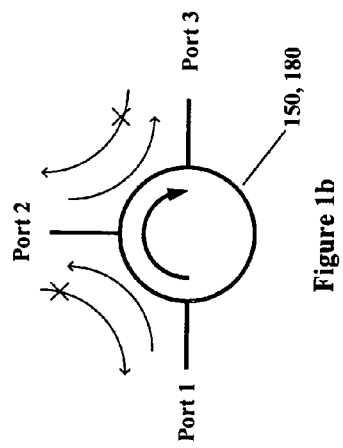

| Function | Selected Device | Advantage |
|---|---|---|
| Master Oscillator | Mode-locked Semiconductor Laser | Compactness<br>Simple Electrical Pumping |
| Stretcher and Compressor | Chirped Fiber Bragg Grating | Compactness<br>Large Dispersion<br>Dispersion Manipulation<br>Inherent Beam Shaping |
| Power Amplifiers | Semiconductor Optical Amplifiers | Compactness<br>Simple Electrical Pumping |

Figure 2

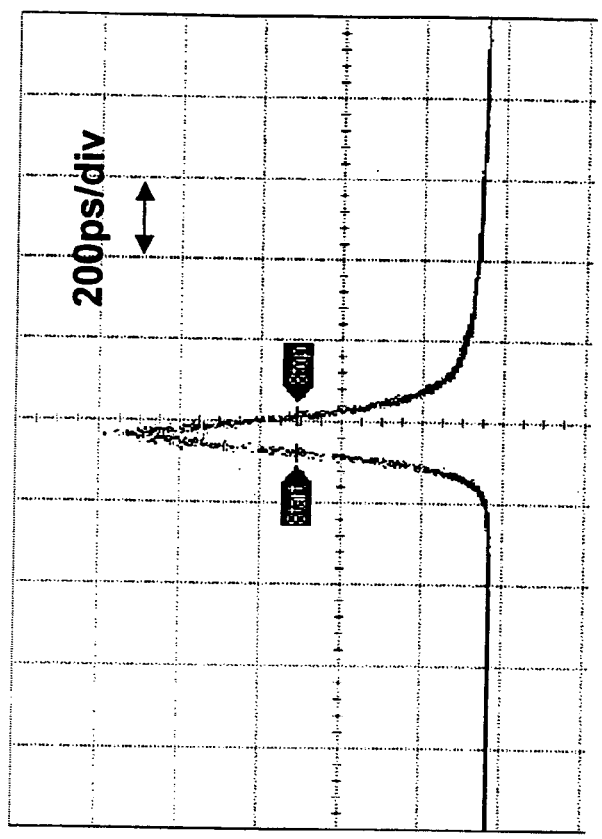
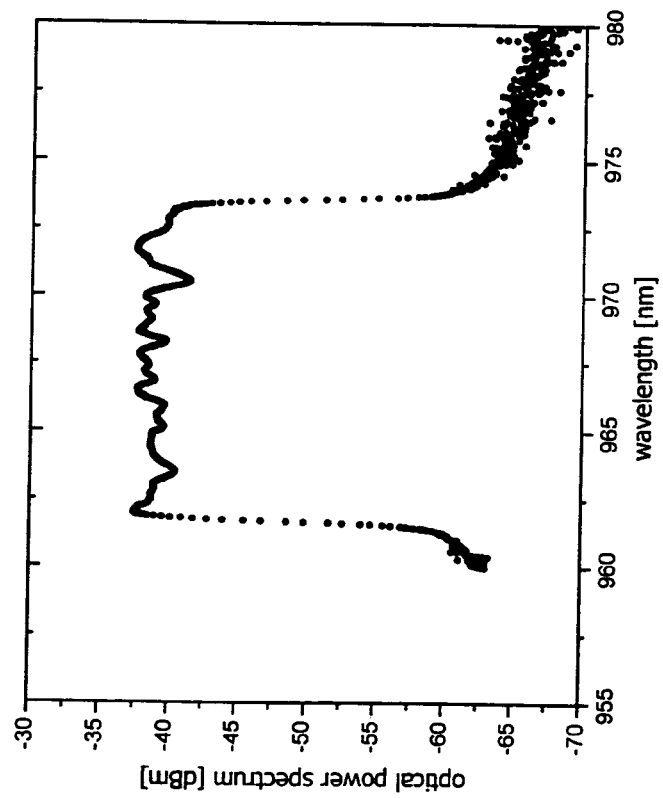
Figure 4b
Figure 4a

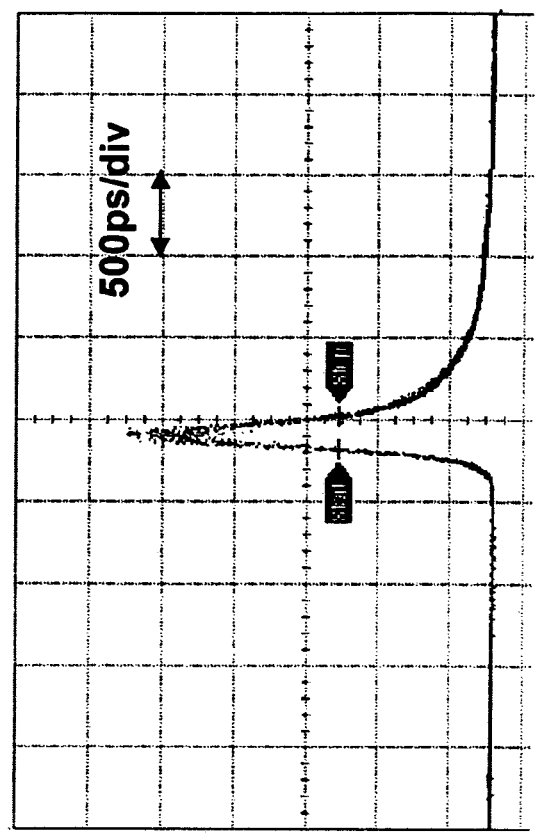
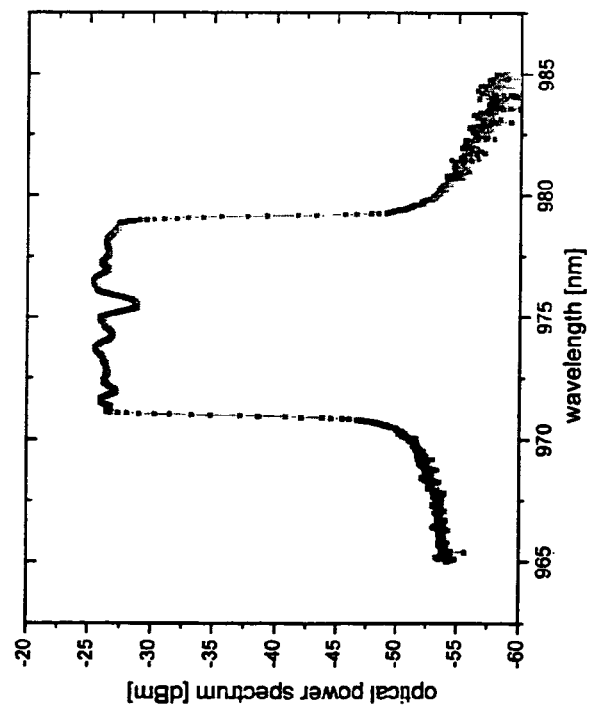
Figure 5b
Figure 5a

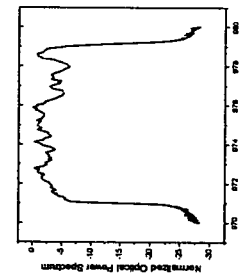
Figure 7a
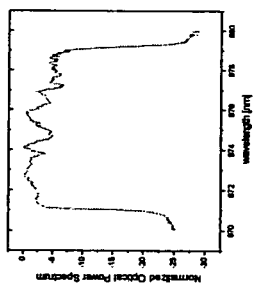
Figure 7c
Figure 7b
Figure 7d

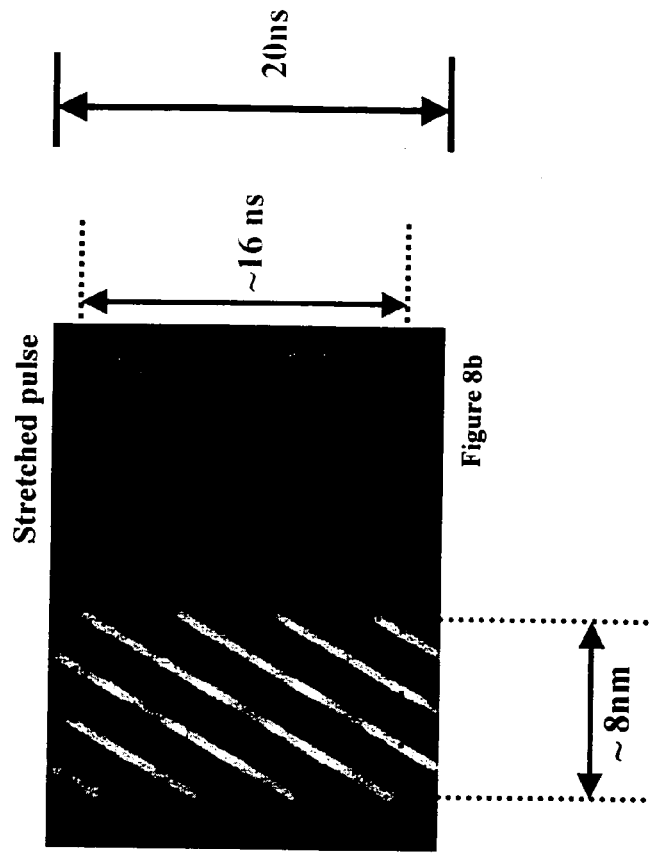
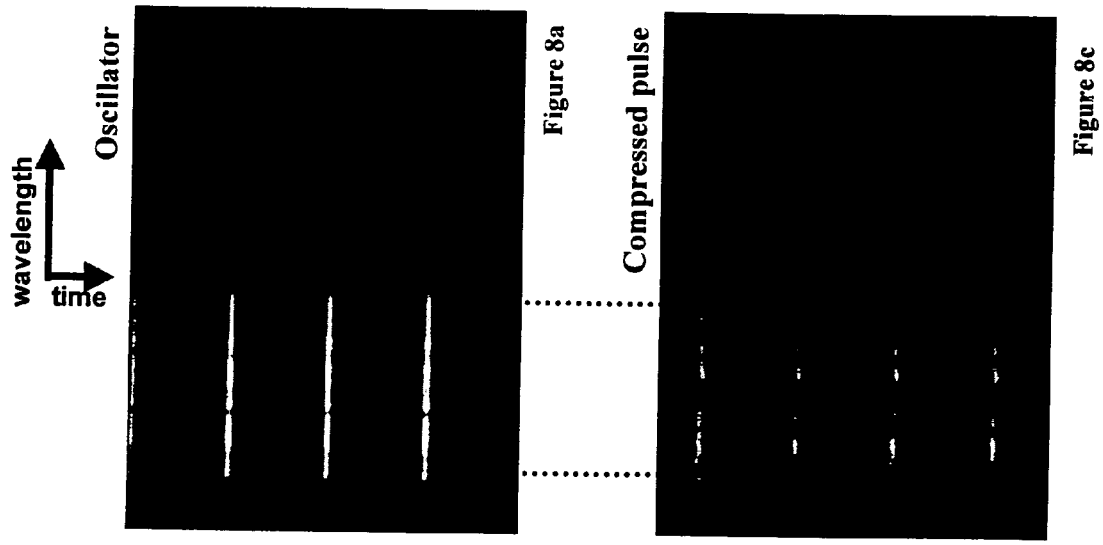
Figure 8a
Figure 8b
Figure 8c

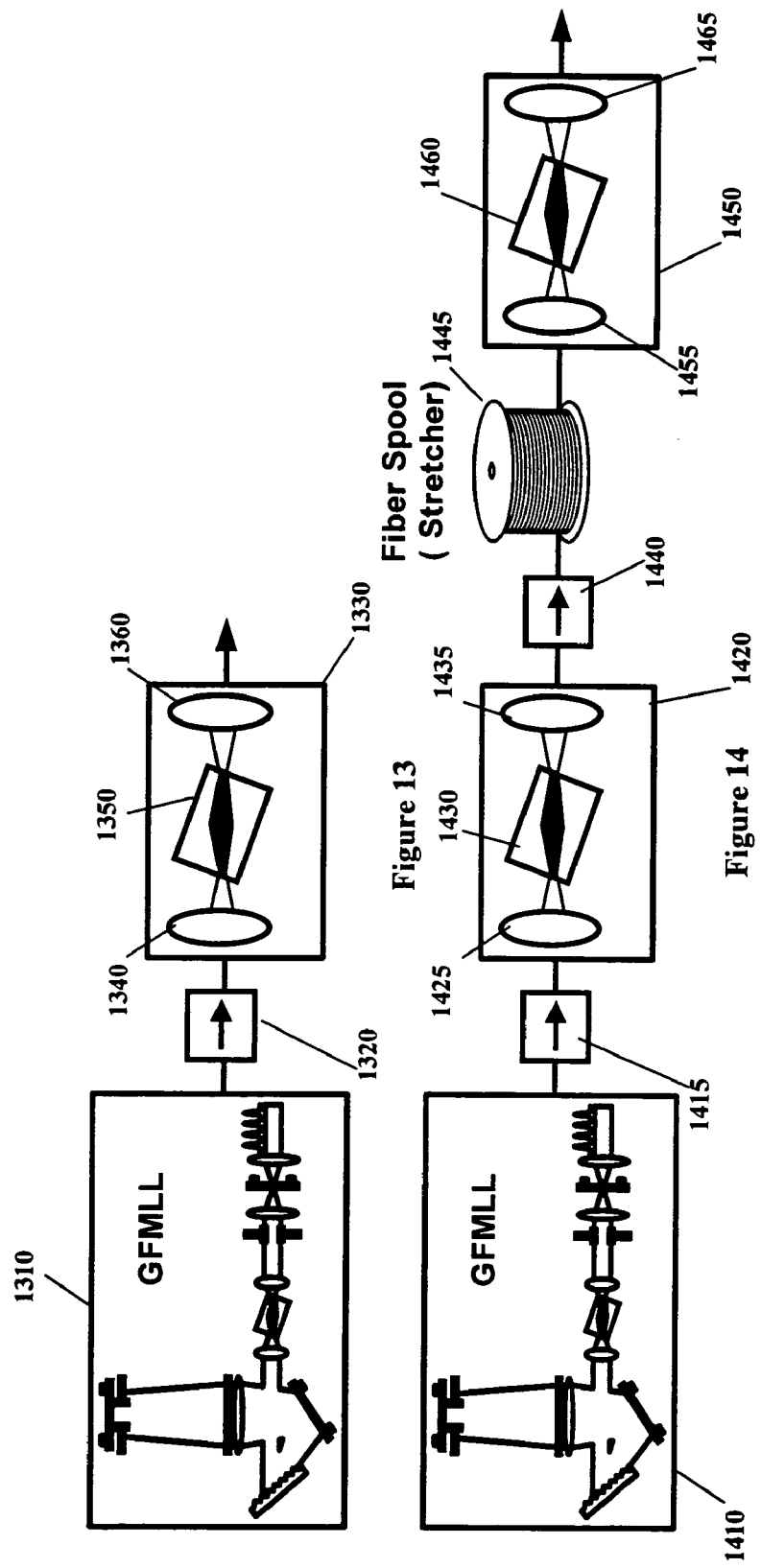

|  | operating condition | average power | energy per pulse | gain/loss |
|---|---|---|---|---|
| oscillator | 200MHz | ~7mW | 35pJ | |
| pulse picker | 50MHz 250mA+44mV | 12mW | 240pJ | 8.34dB |
| stretcher | | 1.6mW | 32pJ | -8.75dB |
| preamplifier | 125mA DC | 16.3mW | 326pJ | 10.1dB |
| 1st amplifier | 500mA DC | 162mW | 3.24nJ | 9.97dB |
| 2nd amplifier | 16A peak 100ns/10kHz | 3.8mW | 76nJ | 13.7dB |
| total gain ~ 33.3 dB | | | | |

Figure 20b

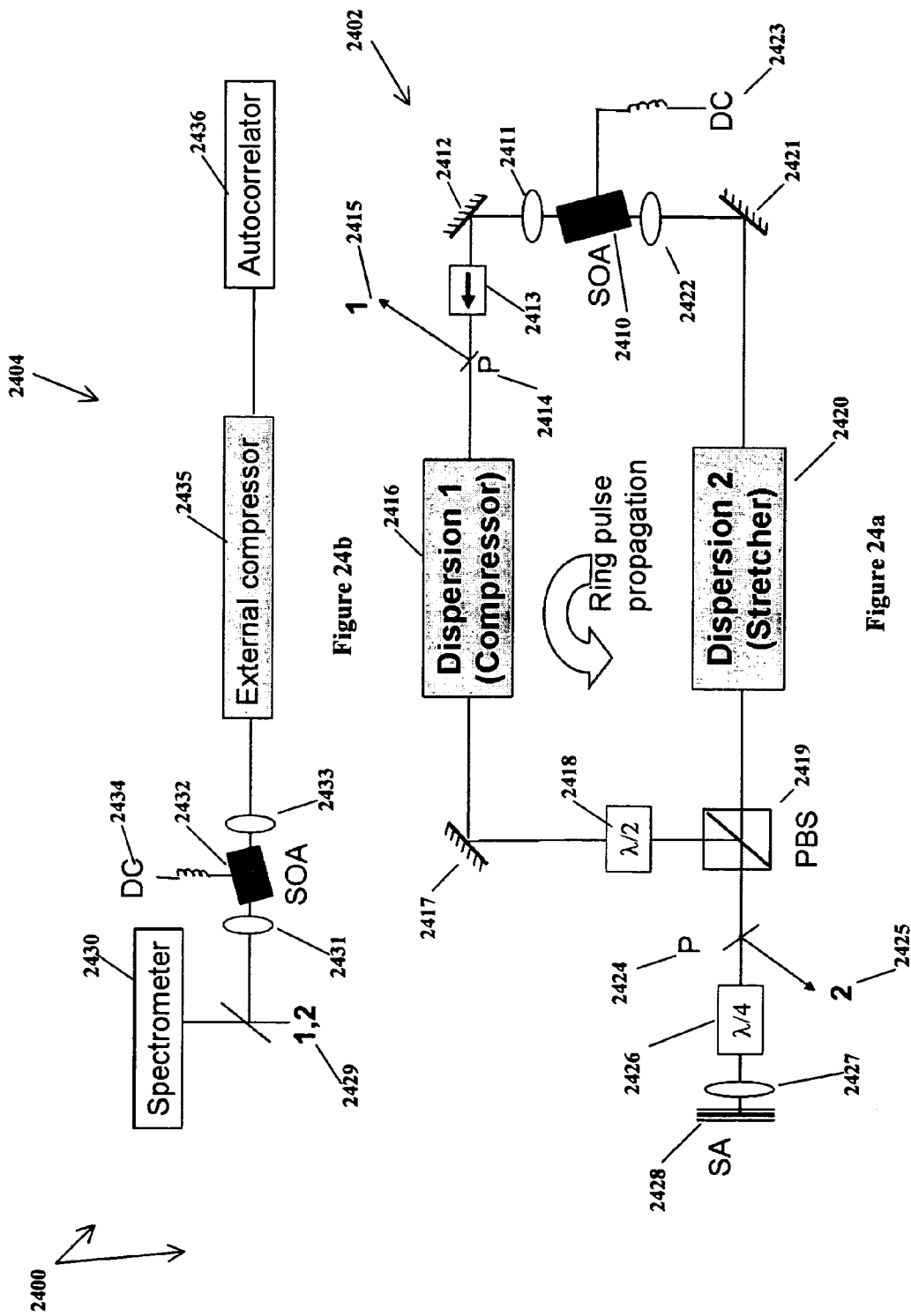

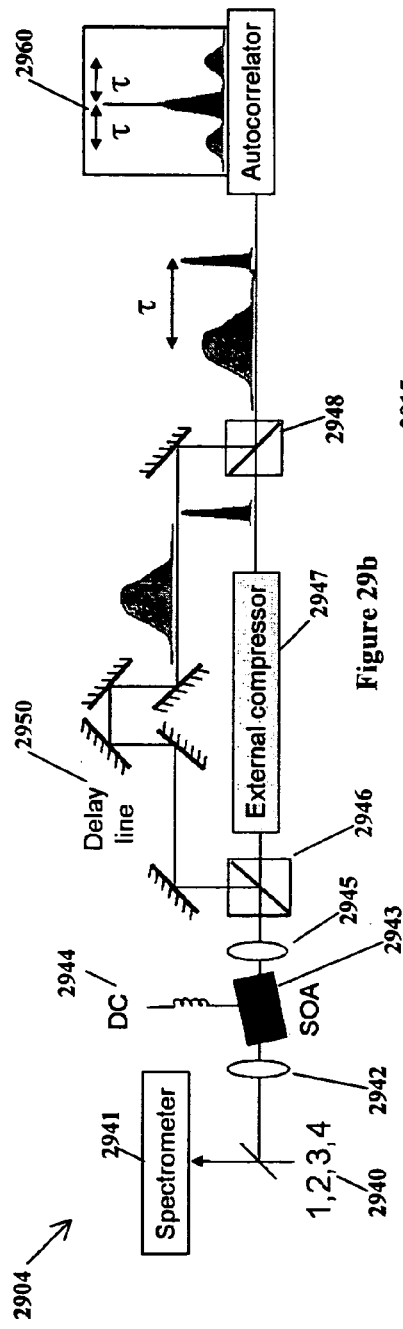
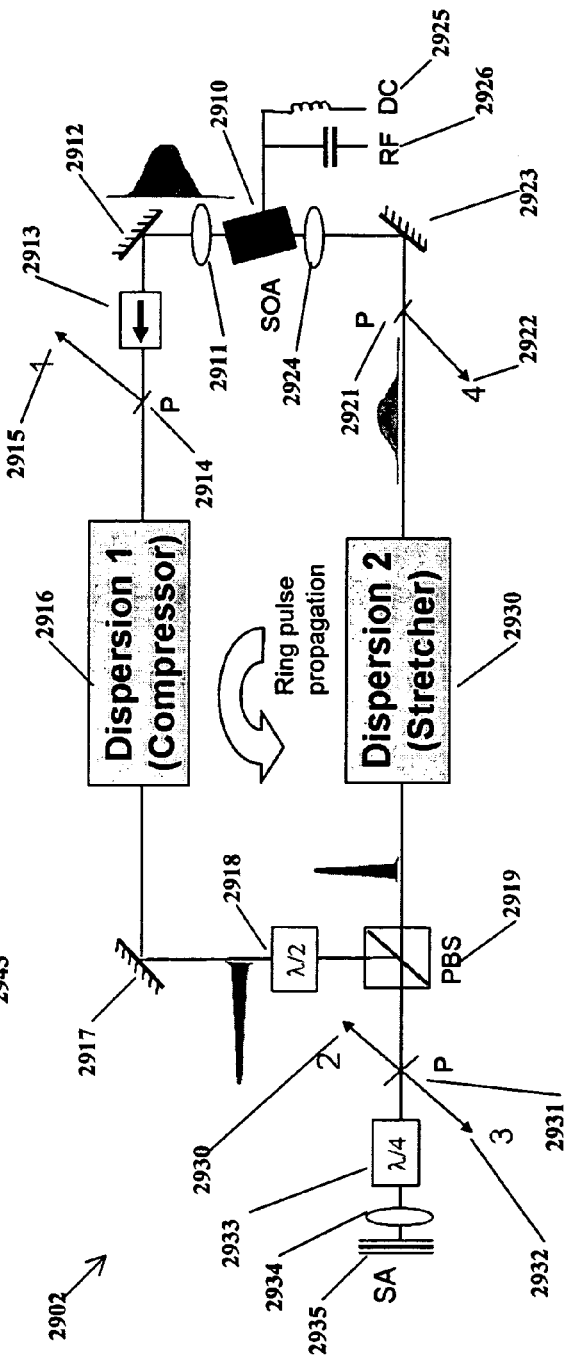
Figure 29b
Figure 29a

| Quantity | Value |
|---|---|
| SOA small signal gain exponential coefficient | 96 cm$^{-1}$ |
| SOA saturation energy | 20.14 pJ |
| SA unsaturated reflectivity | 2.2 % |
| SA saturation energy | 0.31 pJ |
| Integrating SPM coefficient | 0.35 pJ$^{-1}$ |
| Introduced GVD (by dispersion element 2) | 4.1 ps/nm |

Figure 33

EXTREME CHIRPED/STRETCHED PULSED AMPLIFICATION AND LASER

The invention claims the benefit of priority to U.S. Provisional Application 60/472,383 filed May 22, 2003.

This invention was funded in part by Defense Advanced Research Projects Agency contract no. MDA9203C0043 and funded in part by National Science Foundation contract no. ECS-071941.

FIELD OF USE

This invention relates to lasers, in particular to methods, devices and systems for generating ultra-short optical pulses with very high power by stretching optical pulses to durations longer than the energy storage time of an optical amplifier, and for deployment of an extreme chirped pulse amplification (XCPA) effect in an laser oscillator and an external amplification.

BACKGROUND AND PRIOR ART

Semiconductor gain mediums have a short energy storage lifetime which makes energy extraction from the semiconductor gain medium less efficient compared with other gain mediums that have a longer energy storage lifetime. That is, a semiconductor optical amplifier is easily saturated and, after reaching the saturation regime, energy extraction from the semiconductor optical amplifier is dramatically decreased. It is well known that semiconductor optical amplifiers are not a proper optical amplifier for high power generation.

Previously, external cavity mode-locked semiconductor laser oscillators did not use dispersion management schemes that provide breathing mode operation. In non-breathing modes of operation, laser pulse time duration is similar at all cavity points. However, the preferable pulse duration, prior to a saturable absorber, is much shorter than pulse duration passing through the semiconductor gain media. Short pulses below ~1 ps. bleach the saturable absorber much easier, but such short pulses would initiate different ultra-fast dynamic processes in gain media which are detrimental for the laser operation—the gain would be decreased and the pulse would be strongly nonlinearly chirped. The nonlinear chirp is very difficult to compensate and generate in the end ultrashort pulses

SUMMARY OF THE INVENTION

A primary objective of the present invention is to provide methods, devices and systems for generating stretched, linearly chirped optical pulses with high power from the all-semiconductor laser oscillator that could be efficiently externally compressed to approximately 200 fs. This is achieved in the breathing mode operation of laser oscillator by stretching time duration of the pulses passing the gain media, to suppress self-phase modulation, and compressing it subsequently prior to the saturable absorber.

A secondary objective of the present invention is to provide methods, devices and systems for generating ultra-short optical pulses with very high power by increasing the temporal duration of the pulses passing the gain medium to be longer than the storage time of amplifying medium. If the time duration of the optical pulse is longer than the energy storage lifetime, then the energy extraction from semiconductor gain medium is not limited by the energy storage lifetime of the semiconductor optical amplifier but by continuous saturation power multiplied by the time duration of optical pulse. This is done by an extreme chirped pulse amplification technique using chirped fiber Bragg grating.

A third objective of the present invention is to provide methods, devices, and systems to deploy an extreme chirped pulse amplification (XCPA) effect in an laser oscillator and to generate extremely linearly chirped high-power pulses externally compressible to approximately 200 fs.

Preferred embodiment methods and systems of generating ultrashort optical pulses having increased optical power can include generating optical pulses from a source, such as a modelocked laser source, stretching duration of each of the optical pulses to be greater than energy storage time of an optical amplifier, amplifying the stretched optical pulse with the optical amplifier, and compressing the optical pulse, wherein optical power of the compressed optical pulse can be increased at least approximately 100 times.

The optical pulses can be linear chirped pulses. The mode locked laser source can be a gain-flattened mode-locked laser source, and the optical amplifier can be a semiconductor optical amplifier, such as a grating coupled surface emitting optical amplifier.

Preferred embodiments of an extreme chirped pulse amplifier (XCPA), can include methods, systems and devices for generating optical pulses, stretching temporal duration of the optical pulses to be greater than storage time of an amplifying medium, amplifying the stretched optical pulses, and compressing the stretched optical pulse, wherein higher power optical pulses are generated.

Additional preferred embodiment methods and systems of generating ultrashort optical pulses having increased optical power can include generating optical pulses with high optical energy and a linear chirp, stretching the duration of each optical pulse to be greater than the energy storage time of an optical amplifier, amplifying the stretched optical pulse with said optical amplifier, compressing the optical pulse, wherein the optical power of compressed optical pulse is increased.

The embodiments can include modulating the optical pulse whereby the optical pulse is further shortened, by using an active modulator such as a LiNbO3 modulator. Modulating can also include a passive modulator such as a multiple quantum well saturable absorber.

The embodiments can further rout the compressed optical pulse back to the generating step, and output coupling the compressed optical pulse by an fiber coupler.

Additional preferred embodiments of an extreme chirped pulse amplifier (XCPA) laser can include methods, systems and devices for generating optical pulses, stretching temporal duration of the optical pulses to be greater than storage time of an amplifying medium, compressing the stretched optical pulses and amplifying the compressed optical pulses, wherein higher power optical pulses are generated.

The optical pulses can be generated by a gain-flattened mode-locked laser source. Stretching can include a chirped fiber Bragg grating. Compressing can include a dual pass grating compressor.

The embodiments can include modulating the optical pulse wherein the pulse is further shortened, by using an active modulator such as a LiNbO3 modulator. The modulating can also include a passive modulator such as a multiple quantum well saturable absorber.

The optical pulses can be generated by a gain-flattened mode locked laser source, and the stretching and compressing can include a chirped fiber Bragg grating.

Further objects and advantages of this invention will be apparent from the following detailed description of the presently preferred embodiments which are illustrated schematically in the accompanying drawings.

BRIEF DESCRIPTION OF THE FIGURES

FIG. 1a shows a setup of a preferred embodiment of the extreme chirped pulsed amplifier invention.

FIG. 1b shows a detail of the optical circulator with arrows indicating the direction of optical pulse travel.

FIG. 2 is a chart showing the components used for extreme chirped pulse amplification (XCPA) and the advantage of each for the setup of FIG. 1a.

FIG. 4a shows the optical spectrum bandwidth of the GFMLL embodiment of FIG. 3 operating in active mode-lock at approximately a 200 MHz repetition rate.

FIG. 4b shows the mode-locked output pulse shape in time domain as measured by a fast photo-detector and digital sampling oscilloscope for FIG. 3.

FIG. 5a shows the optical spectrum bandwidth of the GFMLL embodiment operating with a bandwidth from approximately 970 nm to approximately 980 nm.

FIG. 5b shows the corresponding mode-locked output pulse shape in time domain as measured by a fast photo-detector and digital sampling oscilloscope.

FIG. 7a shows the reflected optical spectrum of the stretched optical pulse after the CFBG that has the positive dispersion 640 as shown in FIG. 6b.

FIG. 7b shows the streak camera image of the stretched pulse after the CFBG that has the positive dispersion 640 as shown in FIG. 6b.

FIG. 7c shows the reflected optical spectrum of the recompressed pulse after the CFBG that has the negative dispersion 630 as shown in FIG. 6b.

FIG. 7d shows the streak camera image of the recompressed pulse after the CFBG that has the negative dispersion 630 as shown in FIG. 6b.

FIG. 8a shows the streak camera image of the output optical pulse train of the GFMLL oscillator.

FIG. 8b shows the streak camera image of the stretched optical pulse.

FIG. 8c shows the streak camera image of the compressed optical pulse.

FIG. 13 is a schematic representation of the experimental setup to verify the concept of the X-CPA invention using a GFMLL oscillator, optical isolator, and amplifier.

FIG. 14 is a schematic representation of the experimental setup to verify the concept of the X-CPA invention using a GFMLL oscillator, optical isolator, preamplifier, optical isolator, fiber loop as a pulse stretcher, and amplifier.

FIG. 18b shows the chart system parameters and throughputs of the schematic representation of FIG. 18a.

FIG. 20b is a chart showing the system parameters and throughputs of the schematic representation of FIG. 20a.

FIG. 20c shows the optical spectrum of the amplified signal and the ASE (Amplified Spontaneous Emission) noise of the schematic representation of FIG. 20a.

FIG. 24a shows an experimental set-up for dispersion managed semiconductor mode-locked σ-ring cavity laser.

FIG. 24b shows the experimental set-up for diagnostics measurement of spectra and autocorrelation.

FIG. 26 shows pulse second harmonic autocorrelation vs. introduced dispersions of the experimental set-up of FIG. 24a.

FIG. 27 shows pulse spectrum vs. introduced dispersions by element 1 and element 2 of the experimental set-up of FIG. 24a.

FIG. 29a shows the experimental set-up of the hybridly mode-locked σ-cavity semiconductor laser with four outputs for pulse evolution characterization.

FIG. 29b shows the experimental set-up for diagnostics measurement of spectra and autocorrelation.

FIGS. 30a, 30b, 30c, 30d shows the optical spectra of the experimental set-up of FIG. 29a.

FIGS. 31a, 31b, 31c, 31d shows the cross-correlation traces from the experimental set-up of FIG. 29a.

FIG. 33 is a table of the constants used in the simulations.

DESCRIPTION OF THE PREFERRED EMBODIMENTS

Figure 3:
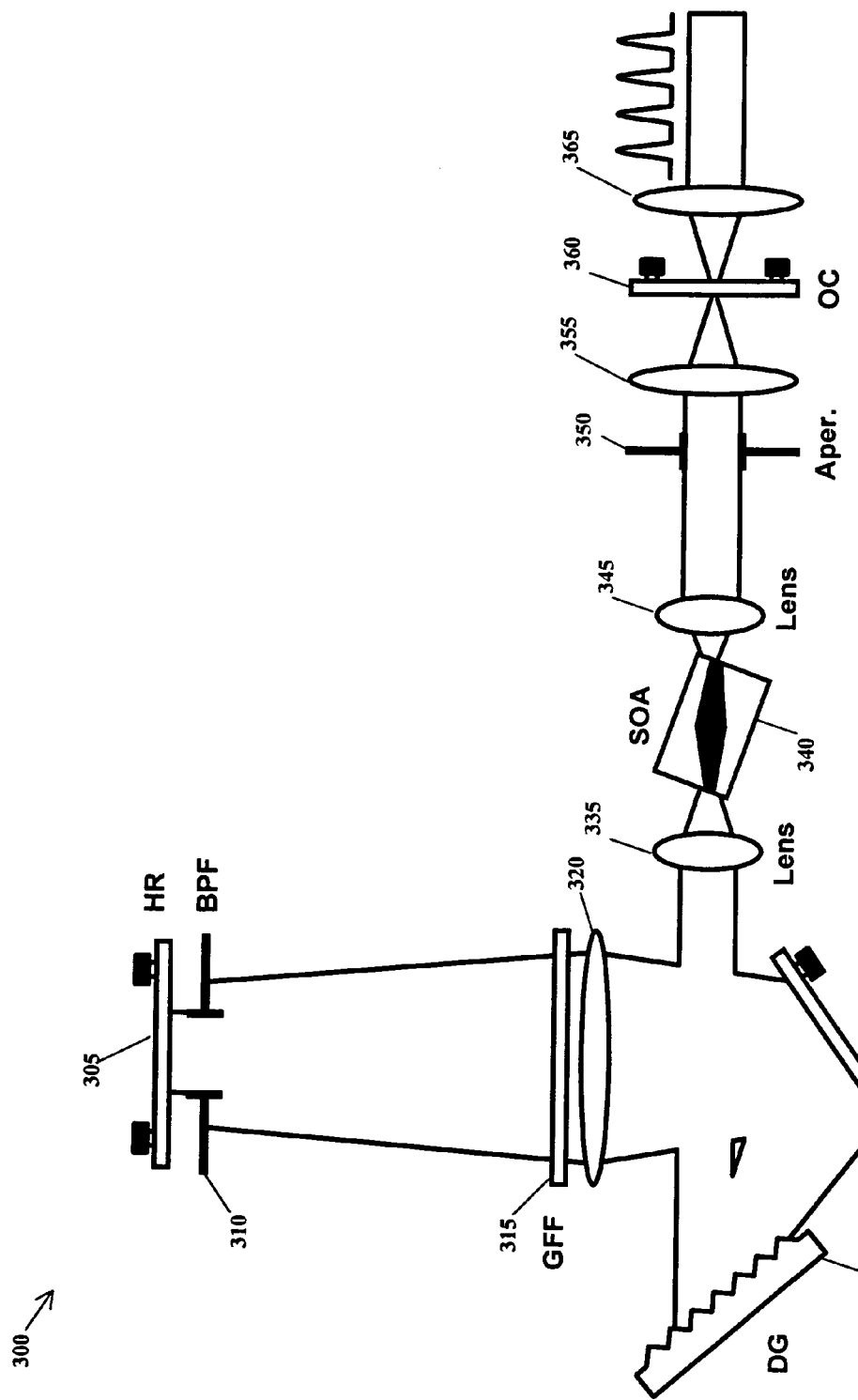
FIG. 3 is a preferred embodiment of the gain-flattened mode-locked laser (GFMLL) oscillator.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

FIG. 1a shows a setup of a preferred embodiment of the extreme chirped pulsed amplifier (X-CPA) invention, 100. Mode-locked laser 110 with semiconductor gain medium is used as an oscillator. The repetition rate of the oscillator is adjustable. Optical isolator (OI) 120, 140 allows the optical pulse to travel in the direction of the arrow and blocks the optical pulse in the reverse direction. Preamplifier 130 is a semiconductor optical amplifier that (a) compensates for losses from the first optical isolator 120, the optical circulator 150, and the chirped Bragg grating 160; (b) develops more power to saturate the amplifier 170; and (c) adjusts the optical pulse repetition rate. Optical circulator (OCIR) 150, 186 is a component that transmits an incoming pulse from port 1 to port 2 while transmitting a second incoming pulse from port 2 to port 3 as illustrated by the arrows in FIG. 1b. The first chirped fiber Bragg grating (CFBG) 160 is used to stretch the optical pulse and the second chirped fiber Bragg grating (CFBG) 190 is used to compress the optical pulse. Amplifier 170 is a semiconductor optical amplifier for high power generation.

By stretching the time duration of the optical pulse duration such that it is longer that the energy storage lifetime of the semiconductor gain medium, the energy extraction from the semiconductor gain medium is not limited by the energy storage lifetime of semiconductor optical amplifier but by continuous saturation power multiplied by the time duration of optical pulse. In the preferred embodiment, chirped fiber Bragg grating 160, 190 provides dispersion of approximately 2000 ps/nm so that an approximate 8 nm pulse was stretched to approximately 16 ns. The recombination lifetime (energy storage lifetime) of the semiconductor gain medium of amplifier 170 can be less than approximately 1 ns.

FIG. 2 is a chart showing the preferred components used for chirped pulse amplification and the advantages as to their use for the setup of FIG. 1a.

GFMLL Oscillator

FIG. 3 is a preferred embodiment of the oscillator 300 for the X-CPA invention 100. The oscillator is a gain-flattened mode-locked laser (GFMLL) where characteristics are such that (1) amplitude, phase, and optical spectrum bandwidth can be manipulated using a Fourier plane inside the cavity and (2) active, passive, and hybrid mode-locking techniques are possible.

The oscillator is comprised of the first high reflector (HR) 305 and second high reflector 330 that are mirrors that exhibit high reflectance at the operating wavelength of the oscillator. The band pass filter (BPF) 310 allows the optical spectrum bandwidth of the oscillator output to be changed. The gain flattening filter (GFF) 315 allows the amplitude of the optical spectrum to be modified. The first lens 320 and the diffraction grating (DG) 325 form the Fourier plane inside the cavity of oscillator 300. The second lens 335 and the third lens 345 collimate the beam to and from the semiconductor optical amplifier (SOA) 340. The aperture 350 provides for selection of the spatial beam profile. The output coupler 360 couples the mode-locked pulse train out from the oscillator. The fourth lens 355 and the fifth lens 365 provide for stabilization of the cavity.

FIG. 4*a* shows the optical spectrum bandwidth of the GFMLL oscillator 300 of FIG. 3 operating in active mode-lock at an approximately 200 MHz repetition rate. Optical bandwidth is approximately 11.4 nm in the range from approximately 961.8 to approximately 973.2 nm. FIG. 4*b* shows the mode-locked output pulse shape of the GFMLL oscillator 300 in the time domain as measured by a fast photo-detector and a digital sampling oscilloscope.

FIG. 5*a* shows the bandwidth of the GFMLL oscillator 300 of FIG. 3 with the Fourier plane manipulated to produce optical characteristics different from that of the prior example. The optical bandwidth is adjusted to approximately 7.8 nm in the range from approximately 971.1 to approximately 978.9 nm with the optical power spectrum equalized to an average power of approximately 15.2 mW. Energy per pulse was approximately 45 pJ. The optical spectrum is adjusted to match the reflection bandwidth of the diffraction grating 325. FIG. 5*b* shows the mode-locked output pulse shape of the GFMLL oscillator 300 in the time domain as measured by a fast photo-detector and a digital sampling oscilloscope. Pulse width is approximately 189 ps.

Active mode-locking for the GFMLL oscillator 300 is achieved by way of gain modulation. Spectrum modulation is achieved by way of the fourier plane inside the cavity. Homogeneous spectrum narrowing is prevented by using a gain flattening filter.

Stretcher and Compressor

Figure 6B:
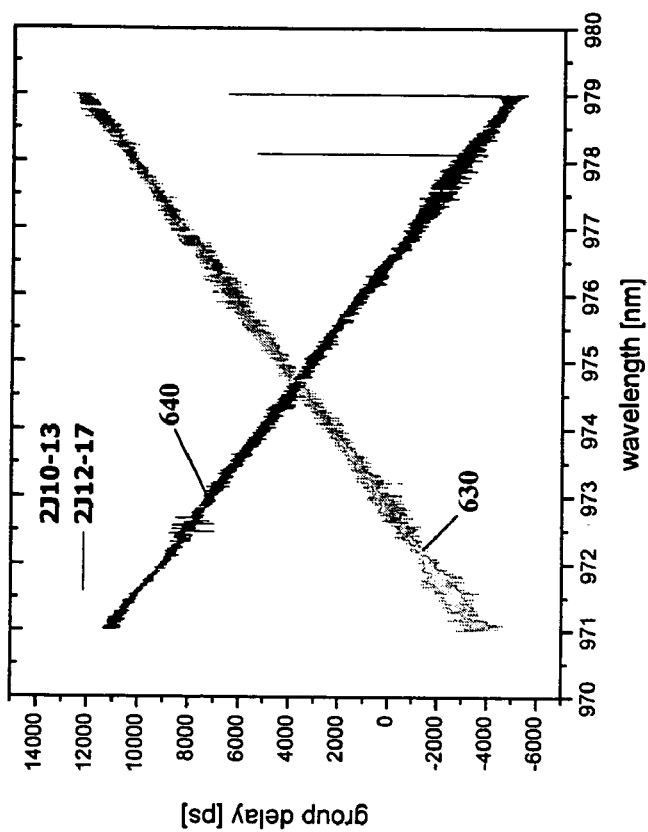
FIG. 6b shows the group delay for a pair of chirped fiber Bragg grating (CFBG) used for stretching/compression of the optical pulse.
Figure 6A:
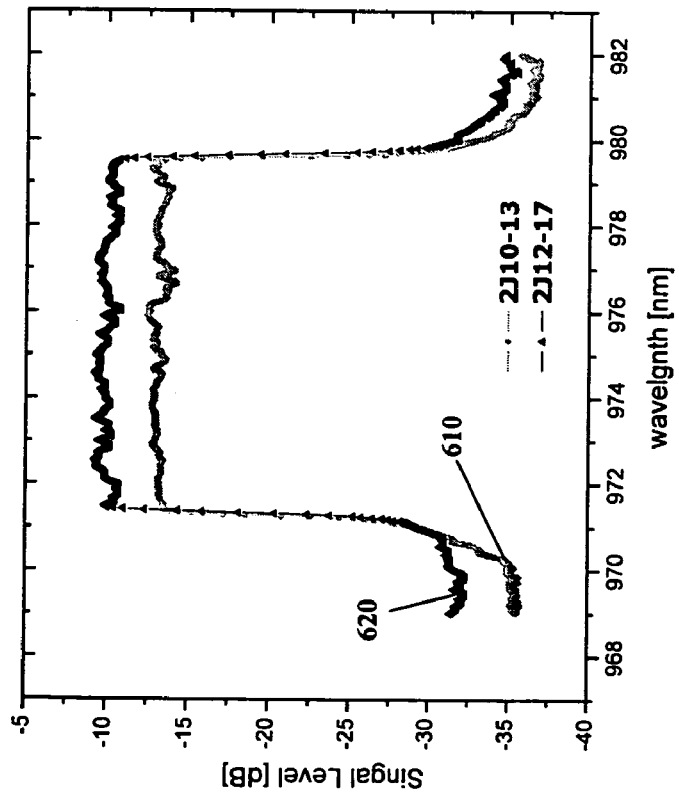
FIG. 6a shows the reflection bandwidth for a pair of chirped fiber Bragg grating (CFBG) used for stretching/compression of the optical pulse.

FIGS. 6*a* and 6*b* show the reflectance spectrum of the chirped fiber Bragg grating (CFBG) 160, 190 of FIG. 1 used for dispersion of the optical pulse. FIG. 6*a* shows the optical spectrum of the reflection 610 from the first chirped fiber Bragg grating 160 with a negative dispersion. FIG. 6*a* also shows the optical spectrum of the reflection 620 from the second chirped fiber Bragg grating 190 with a positive dispersion. The reflectance bandwidth for both the compressor CFBG 160 and the stretcher CFBG 190 is approximately 8 nm in the range from approximately 971 nm to approximately 978 nm and the spectrum exhibits a nice flat reflectance. FIG. 6*b* shows the group delays 630, 640 of the two CFBG 160, 190 used as a stretcher and a compressor to be approximately 2000 ps/nm each. This means an approximately 8 nm bandwidth optical pulse can be stretched to approximately 16 ns.

FIG. 7*a* shows the reflected optical spectrum for the stretcher CFBG 160 mapped onto the streak camera image FIG. 7*b* of the optical pulses from the stretcher CFBG 160. FIG. 7*c* shows the reflected optical spectrum for the compressor CFBG 190 mapped onto the streak camera image FIG. 7*d* of the optical pulses for the compressor CFBG 190. For both FIGS. 7*c* and 7*d*, the vertical axis of the streak camera image represents time and the horizontal axis of the streak camera image represents wavelength. In both images, each optical pulse has a bandwidth of approximately 8 nm and is stretched approximately 16 ns.

FIGS. 8*a* to 8*c* shows streak camera images of the optical pulse at three different points in the extreme chirped pulsed amplifier (X-CPA) invention, 100. FIG. 8*a* shows the optical pulse train as output from the oscillator 110, with an approximately 8 nm optical spectrum bandwidth and a pulse repetition rate of approximately 5 ns. FIG. 8*b* shows the optical pulse stretched to approximately 16 ns from the stretcher CBFG 160. FIG. 8*c* shows the optical pulse compressed from the compressor CBFG 190. For FIGS. 8*a* to 8*c*, the vertical axis of the streak camera image represents time and the horizontal axis of the streak camera image represents wavelength.

Figure 9:
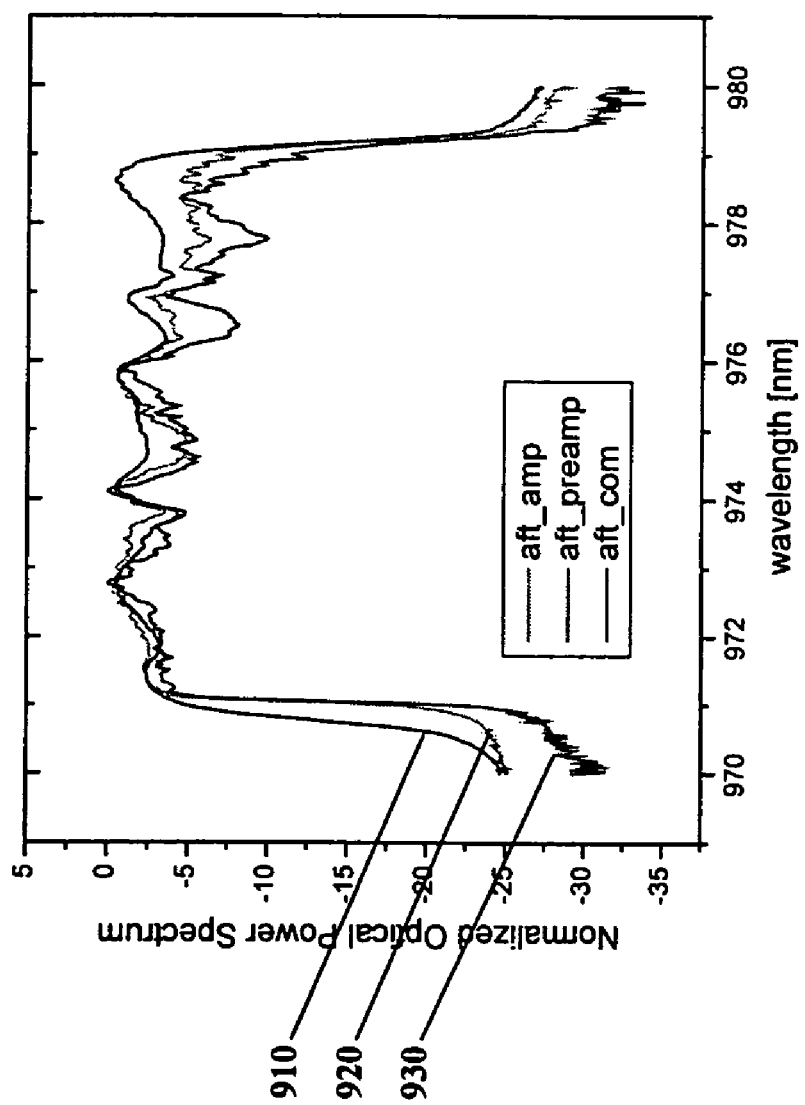
FIG. 9 shows the normalized optical power spectra at three different points in the extreme chirped pulsed amplifier (X-CPA) invention.

FIG. 9 shows the normalized optical power spectra at three different points in the extreme chirped pulsed amplifier (X-CPA) invention, 100. The optical spectrum 910 is measured at the output of the preamplifier 130, the optical spectrum 920 is measured at the output of the amplifier 170, and the optical spectrum 930 is measured at the output of the compressor CBFG 190. Optical power spectra are nearly flat in all instances.

Preamplifier and Pulse Selection

Figure 10:
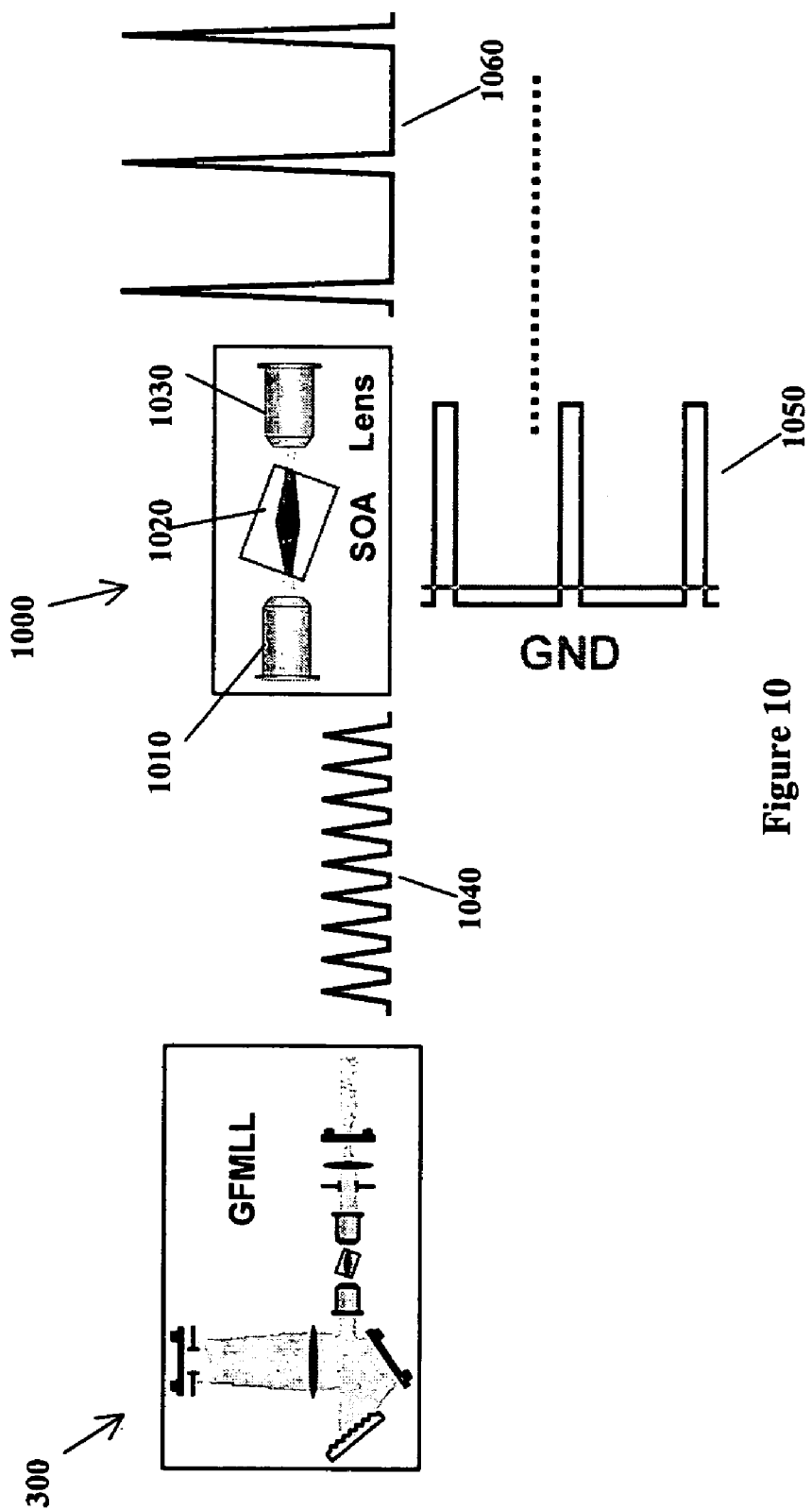
FIG. 10 shows a schematic representation of the GFMLL followed by the preamplifier and pulse picker stage.

FIG. 10 shows a schematic representation of the Gain Flattened Mode-Locked Laser 300 followed by the preamplifier and pulse picker 1000. The preamplifier/pulse picker stage is comprised of a first lens 1010, a semiconductor optical amplifier (SOA) 1020, and a second lens 1030. Modulation 1050 of the SOA 1020 provides amplification and pulse selection of the optical pulse train 1040 from the GFMLL 300.

Figure 11B:
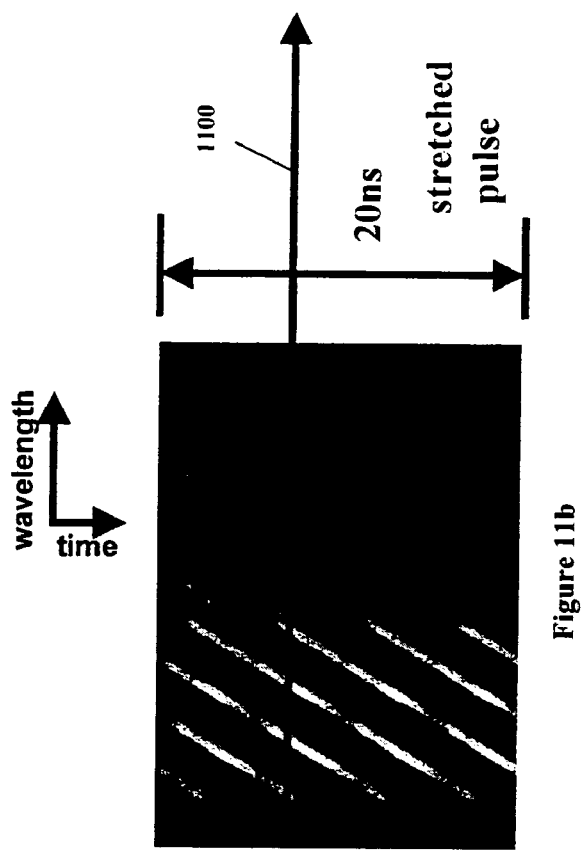
FIG. 11b shows the streak camera image of stretched optical pulse train from the GFMLL oscillator.
Figure 11A:
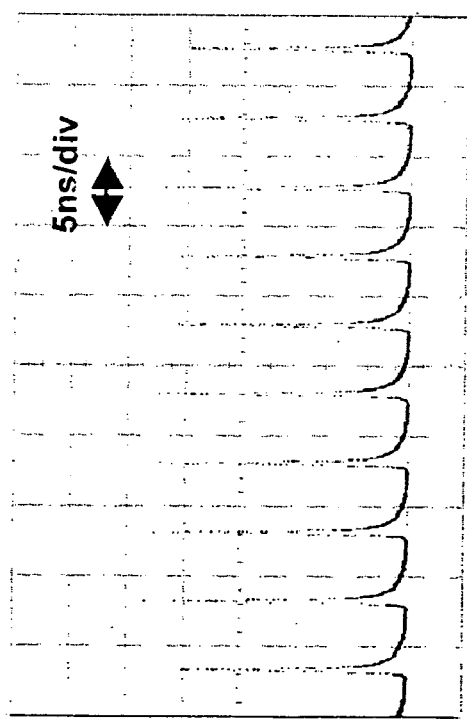
FIG. 11a shows the digital sampling oscilloscope image of mode-locked output pulse train of the GFMLL oscillator that operates at 200 MHz.

FIG. 11*a* shows the mode-locked output pulse shape of the GFMLL oscillator 300 in the time domain as measured by a fast photo-detector and a digital sampling oscilloscope. The repetition rate of the oscillator is 200 MHz. FIG. 11*b* shows a streak camera image (20 ns time window) of the stretched pulse from the GFMLL oscillator 300. FIG. 11*b* has been stretched in the vertical axis to show that optical pulses overlap so that there are approximately four pulses at the same moment as indicated by the horizontal line 1100. Pulse overlap is indicative of inefficient energy sharing between pulses.

Figure 12B:
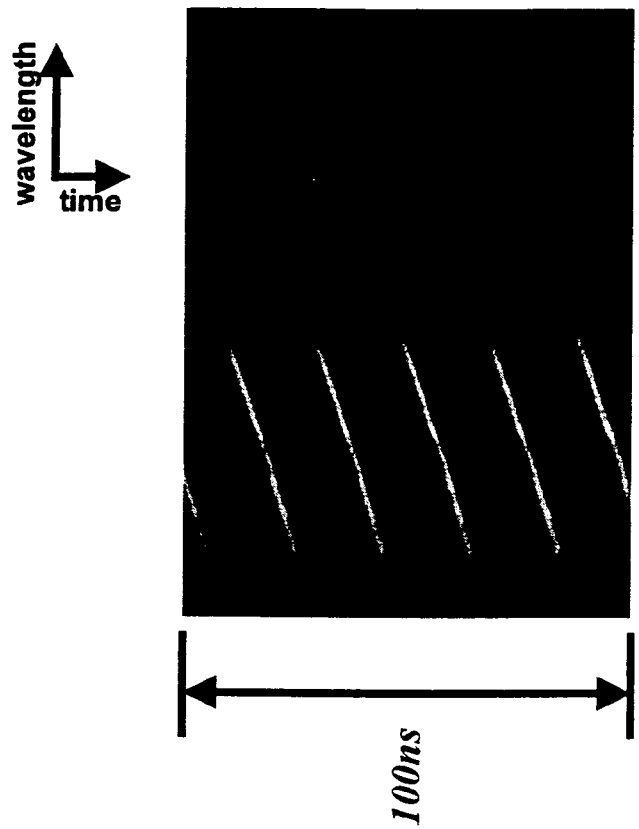
FIG. 12b shows the streak camera image of the output pulse after the preamplifier and pulse picker stage.
Figure 12A:
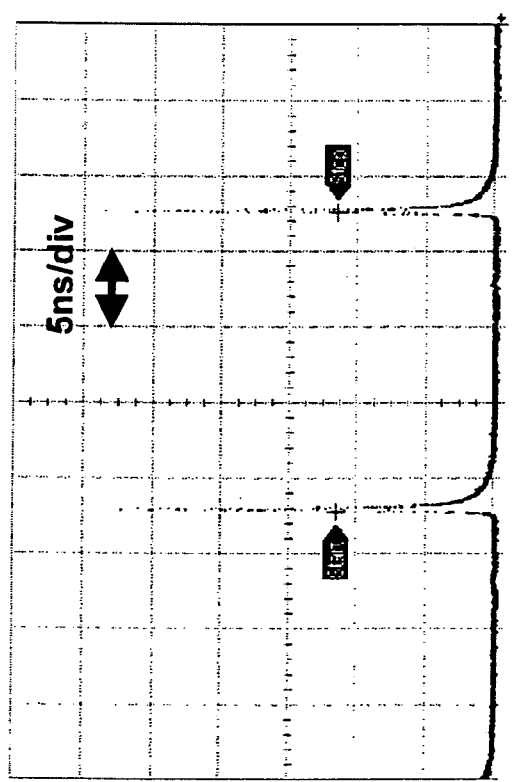
FIG. 12a shows the digital sampling oscilloscope image of the mode-locked output pulse after the preamplifier and pulse picker stage in the time domain.

FIG. 12*a* shows the mode-locked output pulse shape after the preamplifier stage 1000 in the time domain as measured by a fast photo-detector and a digital sampling oscilloscope. The output pulse train 1060 of the preamplifier stage 1000 has been amplified and pulses selected so that the resulting frequency is 50 MHz. FIG. 12*b* shows a streak camera image (100 ns time window) of the stretched pulse from the preamplifier stage 1000. Temporal pulse overlap has been eliminated by the pulse biased preamplifier stage 1000.

Semiconductor Optical Amplifier

The semiconductor optical amplifier of the preamplifier stage 1000 and the amplifier 170 is an approximately 980 nm InGaAs Quantum Well structure that is an angled stripe inverse bow-tie gain guide amplifier. The angled stripe provides low reflectivity. The structure is a low loss that is good for high power generation and provides a good spatial mode profile. The amplifier provides large gain volume and adiabatic beam expansion.

The benefits of using an inverse bow-tie gain guided SOA as the optical gain element in a high-power external cavity semiconductor laser are further discussed in S. Gee et al., "High-Power Mode-Locked External Cavity Semiconductor Laser Using Inverse Bow-Tie Semiconductor Optical Amplifiers", *IEEE Journal of selected Topics in Quantum Electronics*, Vol. 4, pp 209–215.

Concept Verification

FIGS. 13 and 14 are schematic representations of the experimental setup to verify the concept of the X-CPA invention using a semiconductor gain medium. FIG. 13 demonstrates the amount of gain saturation without pulse stretching and is comprised of GFMLL 1310, optical isolator 1320, and amplifier 1330. Amplifier 1330 is further comprised of the first lens 1340, the SOA 1350, and the second lens 1360.

FIG. 14 demonstrates the amount of gain saturation with pulse stretching and is comprised of GFMLL 1410, first optical isolator 1415, preamplifier 1420, the second optical isolator 1440, optical fiber as an optical pulse stretcher 1445, and amplifier 1450. The preamplifier 1420 is further comprised of the first lens 1425, the first SOA 1430, and the second lens 1435. The amplifier 1450 is further comprised of the third lens 1455, the second SOA 1460, and the fourth lens 1465.

Figure 15D:
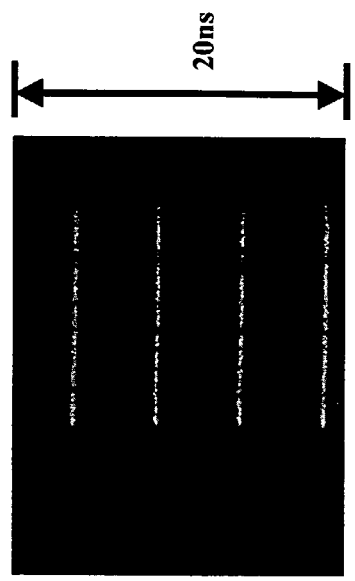
FIG. 15d shows the stream camera image of the optical pulse after pulse stretching using a fiber spool 1445 in FIG. 14.
Figure 15C:
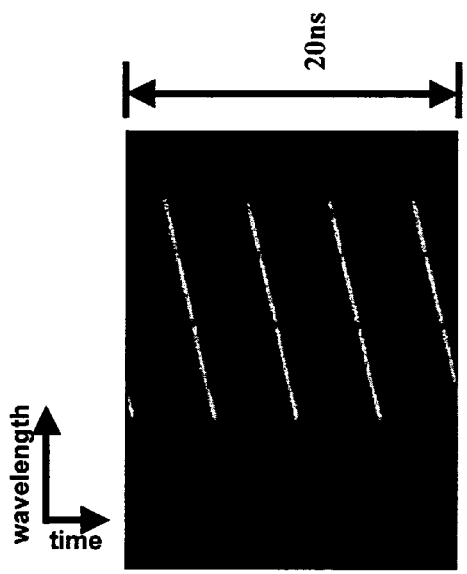
FIG. 15c shows the streak camera image of the optical pulse before pulse stretching.
Figure 15B:
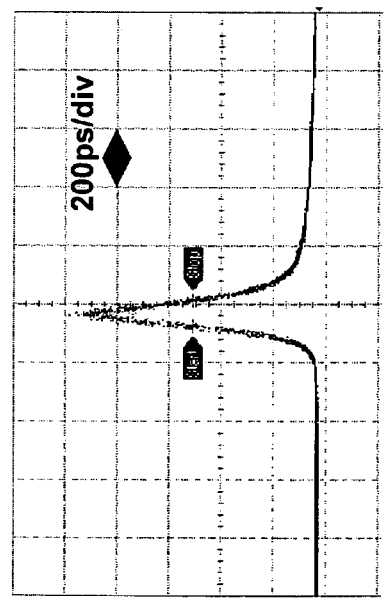
FIG. 15b shows the digital sampling oscilloscope image of GFMLL used as oscillator in the experimental setup of FIGS. 13 and 14.
Figure 15A:
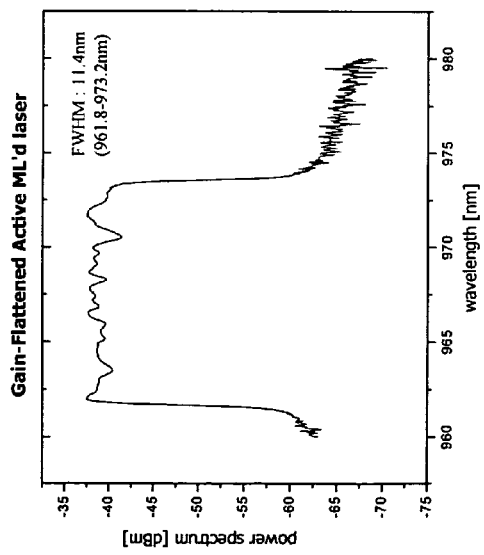
FIG. 15a shows the optical power spectrum results of the GFMLL used as oscillator in the experimental setup of FIG. 14.

FIGS. 15a through 15d show the experimental results of the gain saturation of the experimental setups of FIGS. 13 and 14. FIG. 15a shows the optical power spectrum of the GFMLL 1410 with FWHM pulse width of approximately 11.4 nm and an average power of approximately 3 mW. FIG. 15b shows the mode-locked output pulse shape of the GFMLL oscillator with pulse duration of approximately 96.4 ps. FIG. 15c is a streak camera image of the pulse at the output of the GFMLL 1410 showing no pulse stretching. FIG. 15d is a streak camera image of the stretched pulse after fiber spool 1445 that provides pulse stretching. The pulse is stretched to approximately 2.96 ns and corresponds to approximately −64.9 ps/km/nm.

FIGS. 16a, 16b, 17a, and 17b show experimental measurements of gain saturation determined from the experimental setups of FIGS. 13 and 14.

Figure 16B:
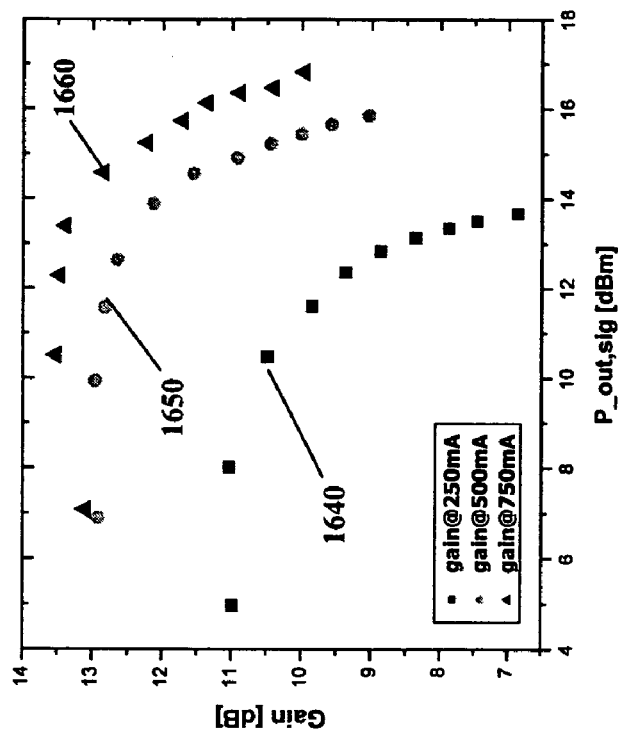
FIG. 16b shows gain vs. output power for an unstretched pulse.
Figure 16A:
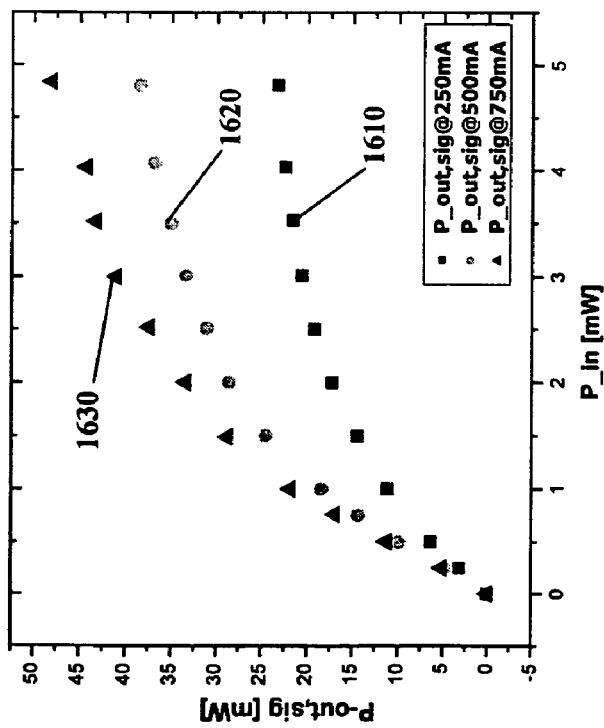
FIG. 16a shows output power vs. input power for an unstretched pulse.

FIG. 16a shows output power vs. input power with an unstretched pulse of approximately 100 ps. The square data points 1610 represent data for an injected current of approximately 250 mA. The circular data points 1620 represent data for an injected current of approximately 500 mA. The triangular data points 1630 represent data for an injected current of approximately 750 mA. FIG. 16b shows gain vs. input power with an unstretched pulse of approximately 100 ps. in length. The square data points 1640 represent data for an injected current of approximately 250 mA. The circular data points 1650 represent data for an injected current of approximately 500 mA. The triangular data points 1660 represent data for an injected current of approximately 750 mA. FIG. 16b shows decreasing gain with output power indicating saturation.

Figure 17B:
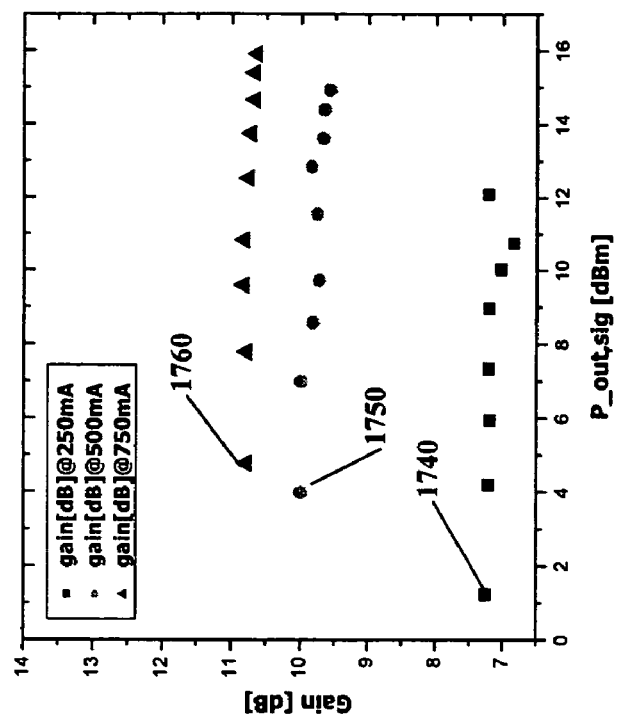
FIG. 17b shows gain vs. output power for a stretched pulse of approximately 3 ns. in time duration.
Figure 17A:
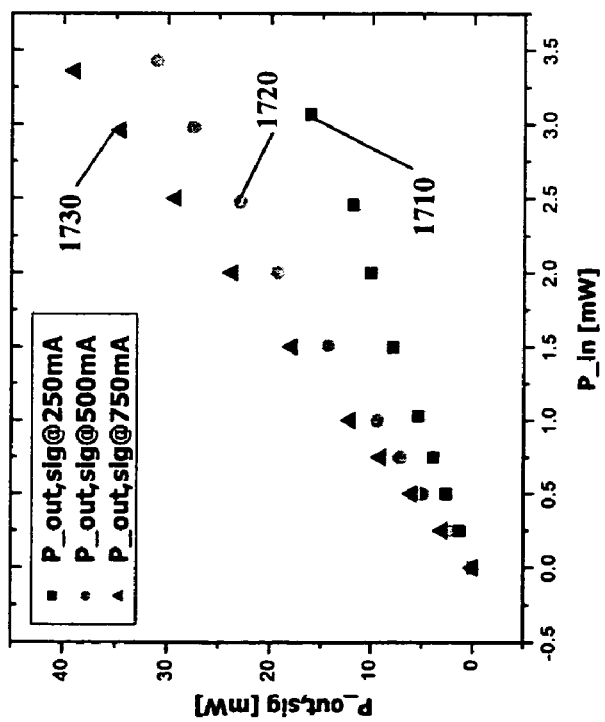
FIG. 17a shows output power vs. input power for a stretched pulse of approximately 3 ns. in time duration.

FIG. 17a shows output power vs. input power with a stretched pulse of approximately 3 ns. The square data points 1710 represent data for an injected current of approximately 250 mA. The circular data points 1720 represent data for an injected current of approximately 500 mA. The triangular data points 1730 represent data for an injected current of approximately 750 mA. FIG. 17b shows gain vs. input power with a stretched pulse of approximately 3 ns. in length. The square data points 1740 represent data for an injected current of approximately 250 mA. The circular data points 1750 represent data for an injected current of approximately 500 mA. The triangular data points 1760 represent data for an injected current of approximately 750 mA. FIG. 17b shows no saturation behavior of the output power so that energy extraction through the XCPA will be improved.

X-CPA System Experimental Results

Figure 18A:
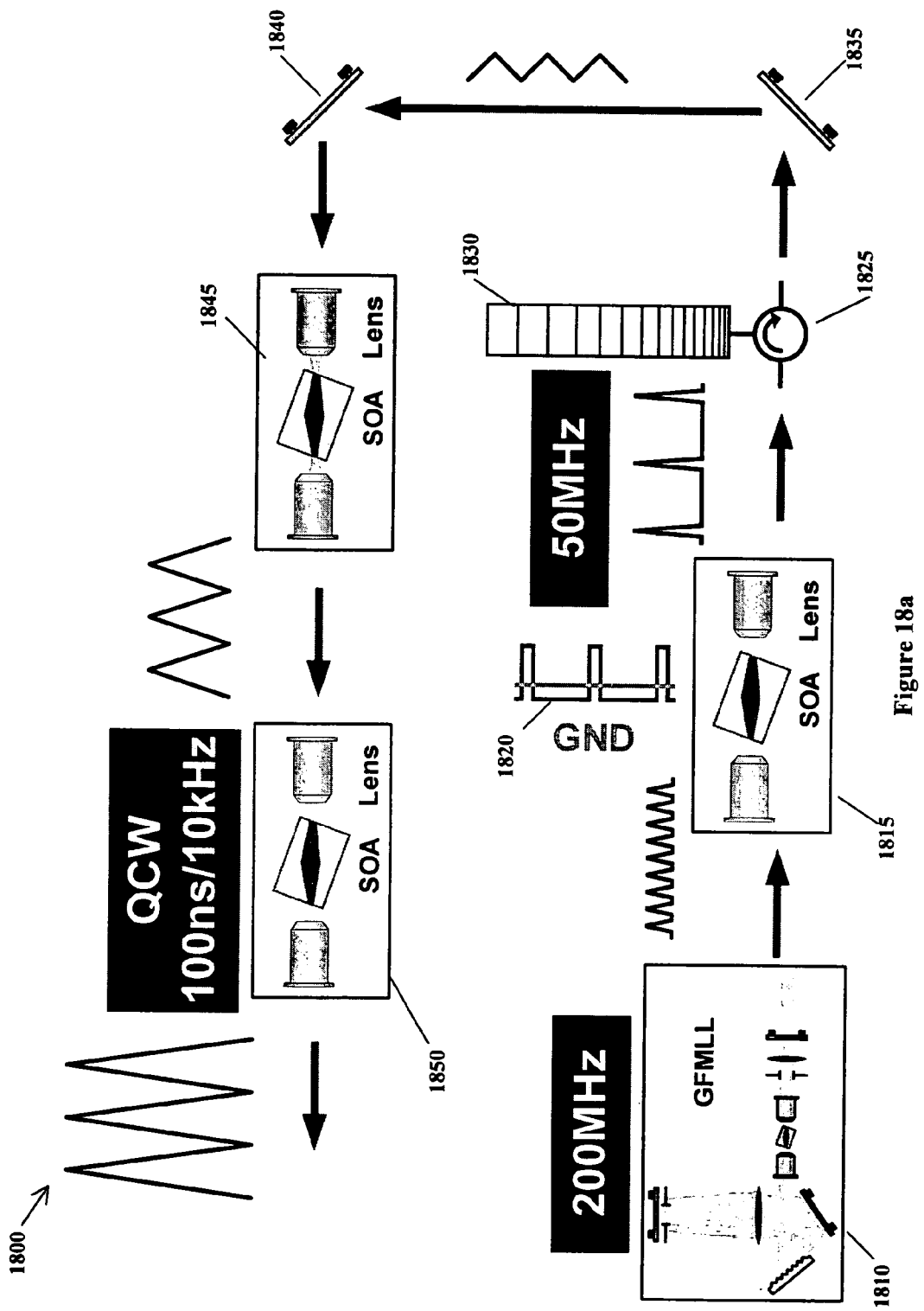
FIG. 18a is another schematic representation of the experimental setup to verify the concept of the X-CPA invention.

FIG. 18a shows a schematic view of the experimental set-up 1800 for the X-CPA invention. The GFMLL 1810 generates a 200 MHz mode-locked pulse fed to preamplifier 1815 that amplifies and selects pulses from the optical pulse train so that the output pulse rate is approximately 50 MHz. The optical pulse is stretched by way of the CFBG 1830 and sent to the amplifier 1845. The optical pulse is further amplified by amplifier 1845 and sent to a second amplifier 1850. The second amplifier 1850 is pulse biased with 100 ns electrical pulse at 10 kHz repetition rate in order to avoid a thermal management due to high current injection.

Figure 18B:
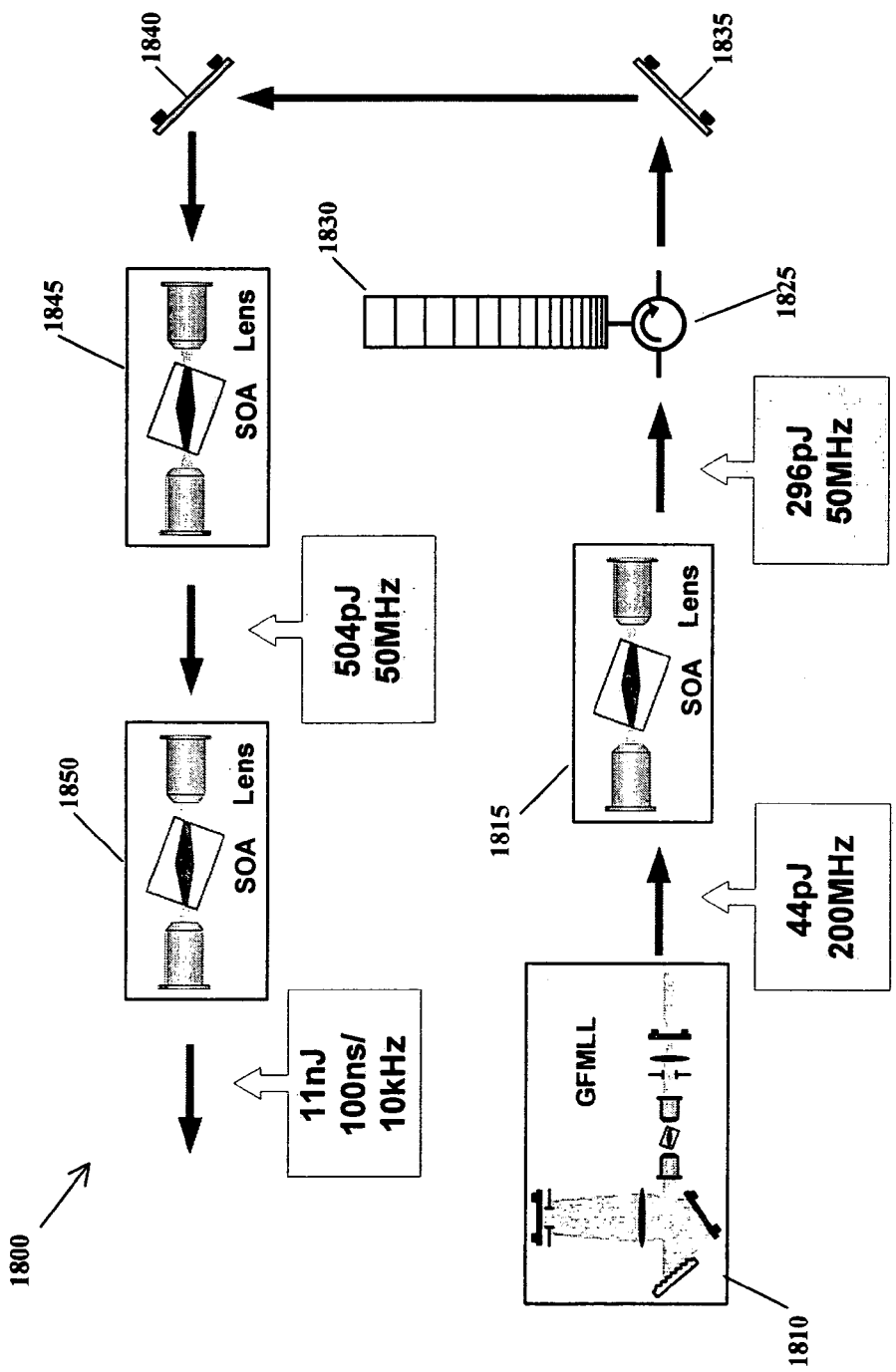

FIG. 18b shows the system throughputs at various points around the experimental setup 1800. At the output of the GFMLL 1810, the optical pulse has energy of approximately 44 pJ. with a pulse rate of approximately 200 MHz. The preamplifier 1815 provides an increase in pulse energy to approximately 296 pJ. with pulse rate of approximately 50 MHz. After first amplifier 1845, optical pulse energy is approximately 504 pJ. with pulse rate of approximately 50 MHz. The optical pulse energy is further increase to approximately 11 nJ. and stretched to an approximately 100 ns pulse with approximately 10 kHz pulse rate by second amplifier 1850.

Figure 19B:
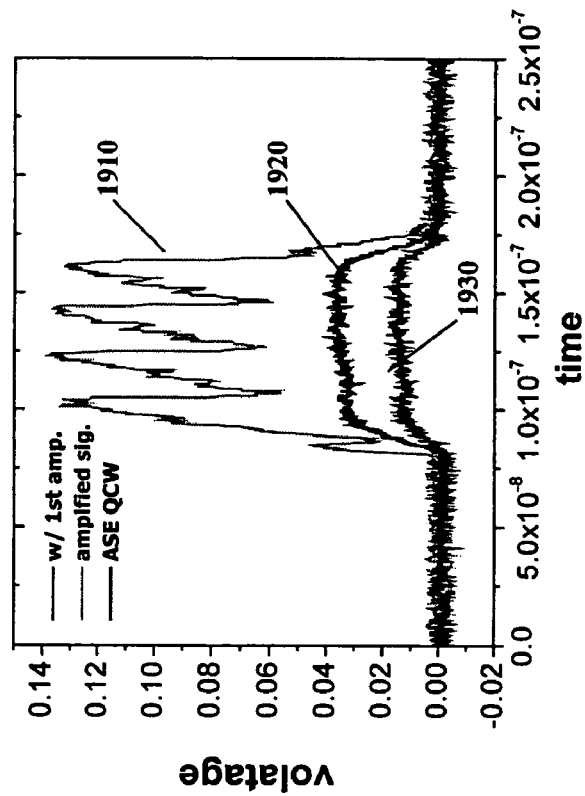
FIG. 19b shows the signals at the output of the 2nd amplifier, at the output of 2nd plus 1st amplifiers, and at the output of the amplified signal through 2nd and 1st amplifiers amplifier.
Figure 19A:
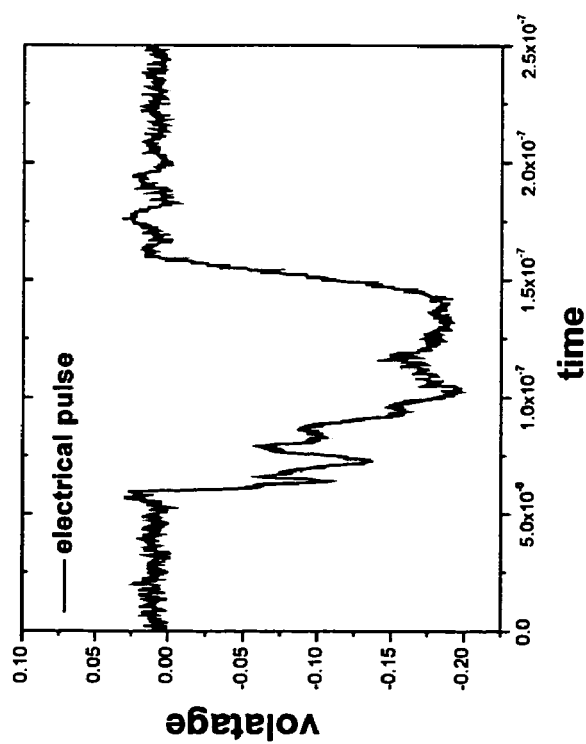
FIG. 19a shows the 100 ns. 10 kHz electrical pulse at the output of the second amplifier 1850.

FIG. 19a shows the approximately 100 ns electrical pulse at approximately 10 kHz pulse rate provided to the second amplifier 1850. FIG. 19b shows the amplified spontaneous emission (ASE) signal 1910 from the first amplifier, the ASE signal 1920 for the first and second amplifiers, and the amplified signal 1930 from the whole system of FIG. 18a at the output of the second amplifier 1850. In comparison with the ASE signal from the first and second amplifiers amplifier 1920, 1930, the dominant amplified signal 1910 due to injection is clearly seen.

Figure 19C:
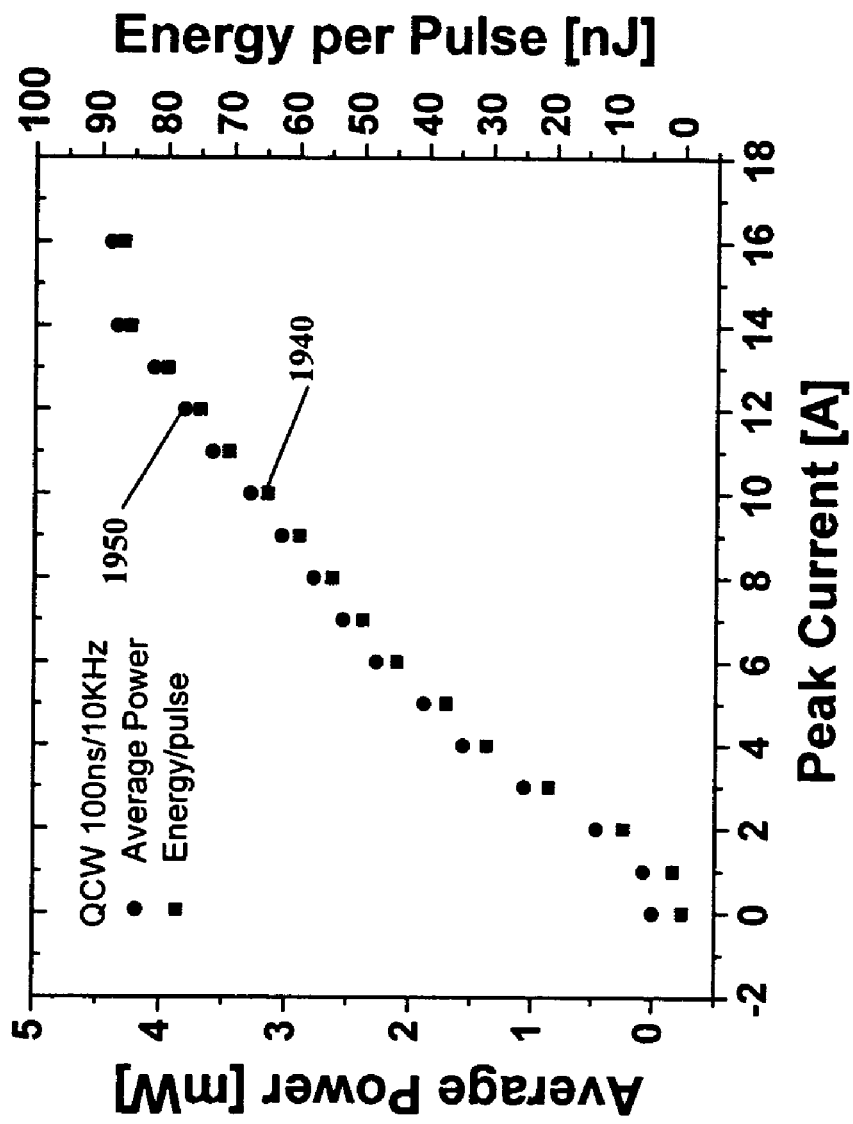
FIG. 19c shows the average power vs. peak current for the second amplifier.

FIG. 19c shows the average power 1950 and energy per pulse 1940 vs. peak current of the device used as second amplifier in the experimental setup 1800. Looking at the amplified spontaneous emission power in quasi-continuous wave operation, at least 100 nJ. per pulse is obtainable from the experimental set-up 1800.

Figure 20A:
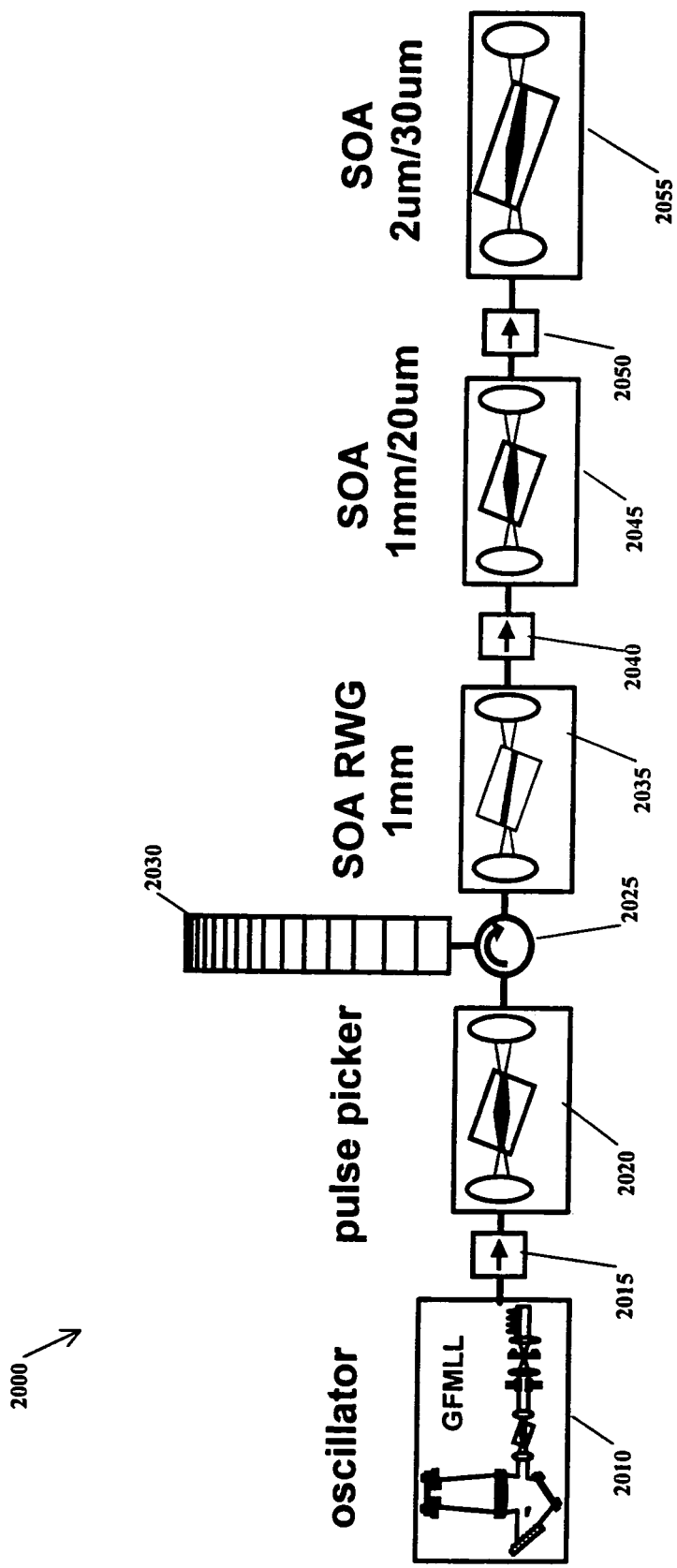
FIG. 20a is a schematic representation of another embodiment of experimental setup to verify the concept of the X-CPA invention.

FIG. 20a shows a schematic view of an experimental set-up 2000 for the X-CPA invention. FIG. 20b shows the operating parameters for the experimental set-up 2000 of FIG. 20a. The GFMLL oscillator 2010 generates a 200 MHz mode-locked pulse fed via a first faraday isolator 2015 to pulse-picker 2020 that selects pulses from the optical pulse train so that the output pulse rate is approximately 50 MHz and provides approximately 8.4 dB gain. The optical pulse is stretched by way of the CFBG 2030 and provided to the pre-amplifier 2035, a RWG SOA, that provides approximately 10.1 dB gain. The optical pulse is passed through the second faraday isolator 2040 and further amplified by the first amplifier 2040 with approximate gain of 9.9 dB, passed through a third faraday isolator 2050 and provided to a second amplifier 2055. The second amplifier 2050 is pulse biased with 100 ns electrical pulse at 10 kHz repetition rate in order to avoid a thermal management due to high current injection. Total gain through the system 2000 is approximately 33.3 dB.

Figure 20C:
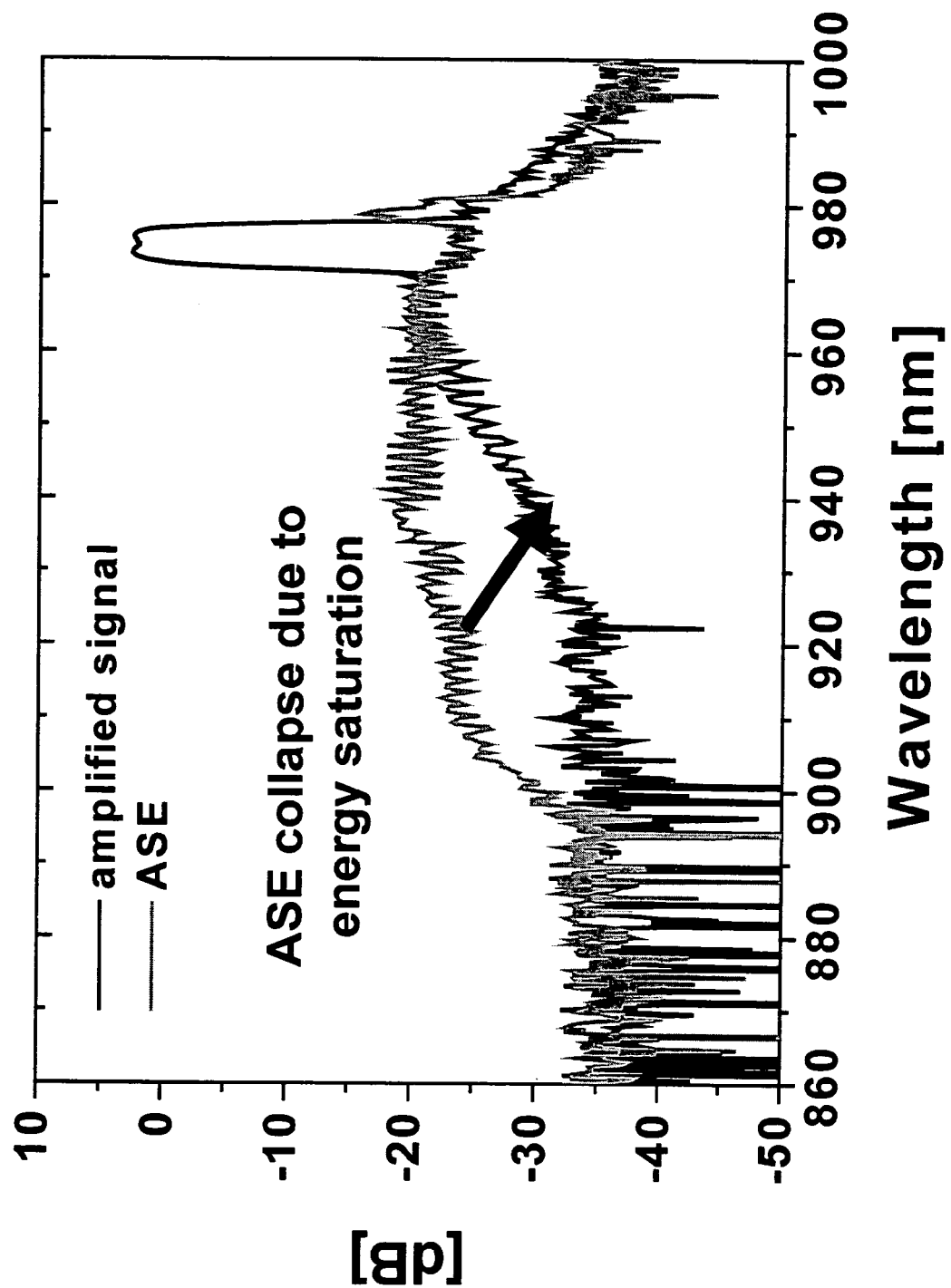

FIG. 20c shows two optical spectrum curves of final amplifier before and after signal injection. When a signal is injected into final amplifier, the strong ASE suppression due to gain saturation is occurred.

Simulation Sequence

Figure 21:
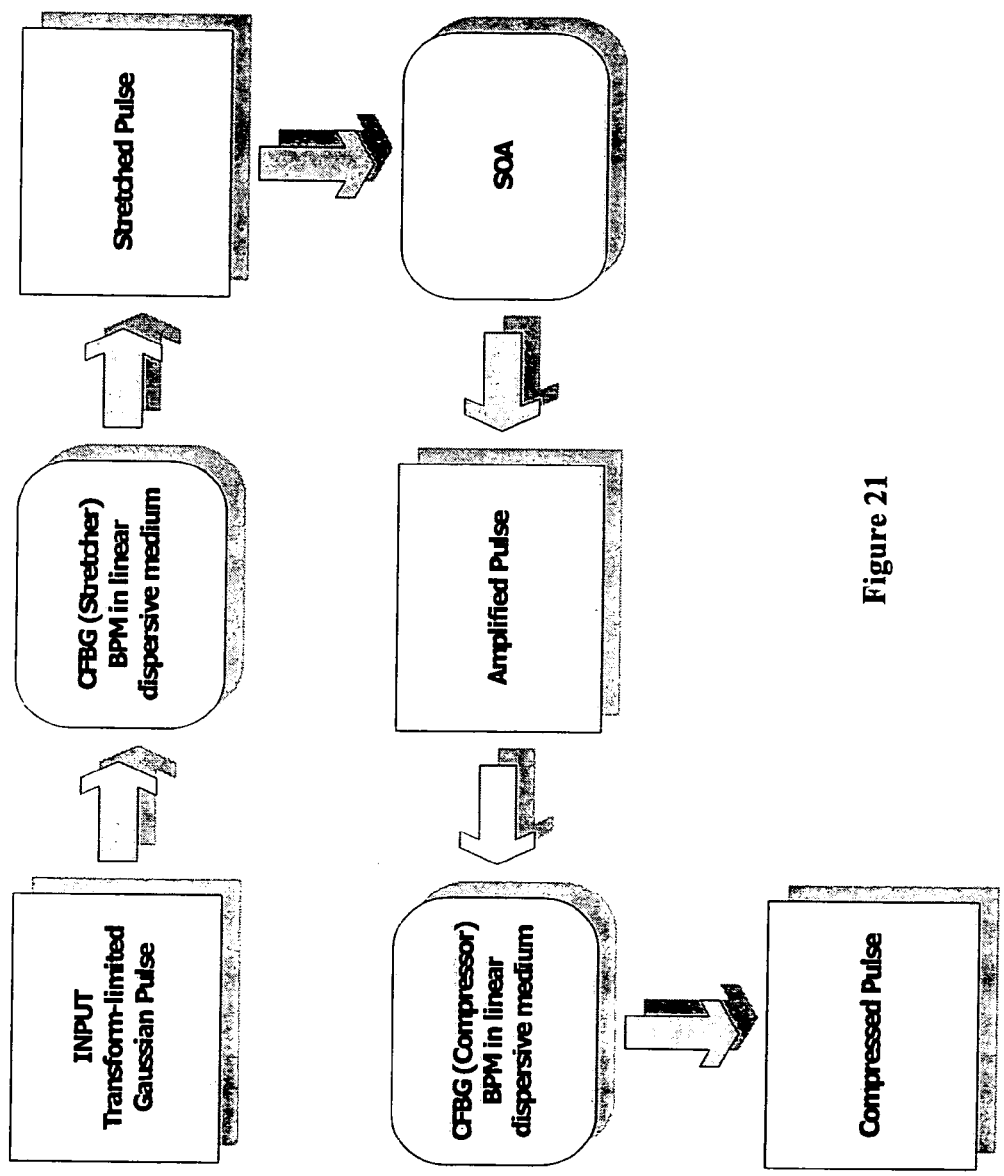
FIG. 21 is a simulation sequence flow chart for the preferred embodiment of the invention.

FIG. 21 is a preferred embodiment of the simulation sequence flow chart for the invention. FIG. 21 explains the effect of the X-CPA in terms of stretched pulse widths. The energy extraction efficiency between unstretched and stretched pulse is simulated using dynamic semiconductor laser rate equations.

For simulation, the oscillator was selected to have parameters of input energy from approximately 0.1 pJ to approximately 1 nJ and a transform-limited Gaussian input pulse with an approximately 1 nm to approximately 5 nm spectrum bandwidth. The amplifier was selected to have saturation energy of approximately 100 pJ, carrier lifetime of approximately 200 ps., line-width enhancement factor of approximately 3, and small signal gain of approximately 30 dB. CFBG constants of both approximately 87.5 ps/nm and approximately 2000 ps/nm dispersion, each with an approximately 1 nm and 5 nm optical spectrum bandwidth, were selected for the simulation.

Figure 22B:
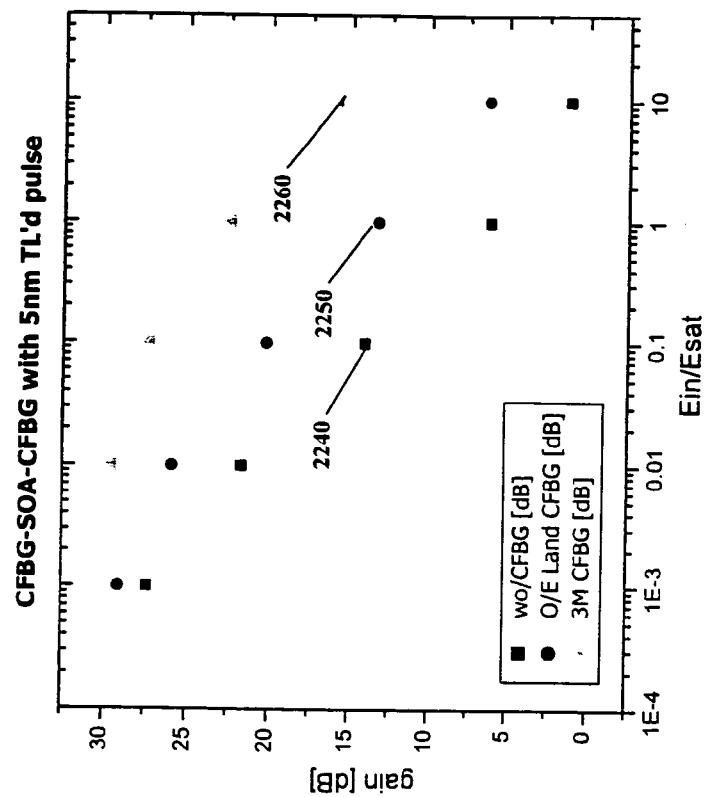
FIG. 22b shows the simulation results of a 5 nm transform limited (TL'd) pulse without pulse stretching, with 87.5 ps/nm/km CFBG and with 2000 ps/nm/km CFBG.
Figure 22A:
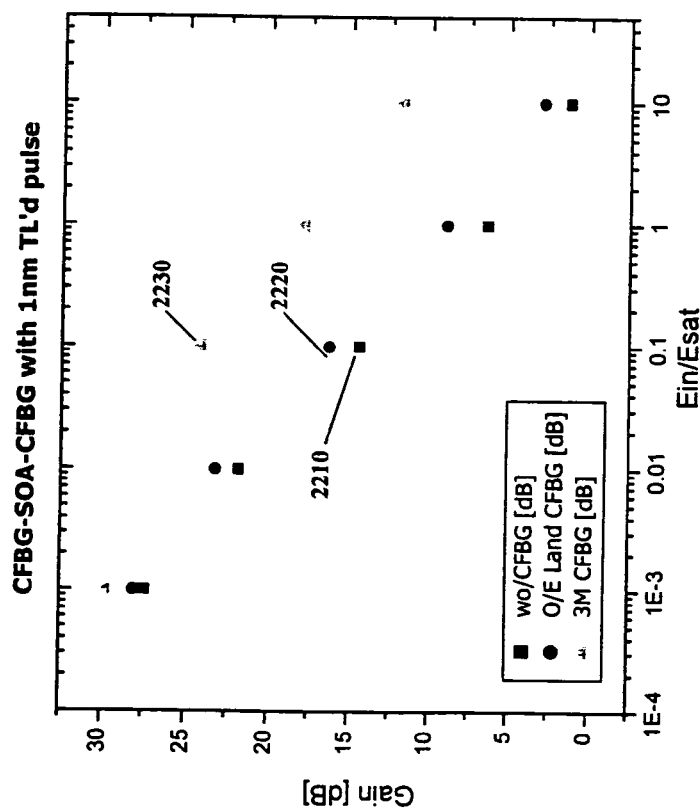
FIG. 22a shows the simulation results of a 1 nm transform limited (TL'd) pulse without pulse stretching, with 87.5 ps/nm/km CFBG and with 2000 ps/nm/km CFBG.

FIGS. 22a and 22b are graphs of the simulation results (gain characteristics) of the invention. The simulation results show how stretching (the basic concept of X-CPA) influences energy extraction efficiency (i.e. extracted gain) in terms of stretched pulse width.

FIG. 22a shows the simulation results of an approximate 1 nm transform limited (TL'd) pulse with gain shown on the vertical axis and normalized saturation level Ein/Esat shown on the horizontal axis. The rectangular data points 2310 represent the unstretched pulse. The circular data points 2320 represent the stretched pulse using the CFBG with an approximately 87.5 ps/nm stretching/compression and approximately 8 nm optical spectrum bandwidth resulting in a pulse length of approximately 87.5 ps. The triangular circular data points 2330 represent the stretched pulse using the CFBG with approximately 2000 ps/nm stretching/compression and an approximately 1 nm optical spectrum bandwidth resulting in a pulse length of approximately 2000 ps.

FIG. 22b shows the simulation results of a 5 nm transform limited (TL'd) pulse with gain shown on the vertical axis and normalized saturation level Ein/Esat shown on the horizontal axis. The rectangular data points 2240 represent the unstretched pulse. The circular data points 2250 represent the stretched pulse using the CFBG with an approximately 700 ps/nm stretching/compression and approximately 5 nm optical spectrum bandwidth resulting in a pulse length of approximately 437.5 ps. The triangular circular data points 2260 represent the stretched pulse using the CFBG with approximately 2000 ps/nm stretching/compression and an approximately 5 nm optical spectrum bandwidth resulting in a pulse length of approximately 10,000 ps.

The simulation results show the gain difference between a 1 nm and 5 nm transform-limited pulse laser with the CFBG of approximately 2000 ps/nm stretching/compression. The simulation results also show that the gain difference between amplification without and with the CFBG of approximately 2000 ps/nm stretching/compression and approximately 8 nm optical spectrum bandwidth is greater than approximately 15 dB with approximately 1 nJ input energy for an approximately 5 nm TL'd pulse.

Breathing MLL with Modulator

Figure 23:
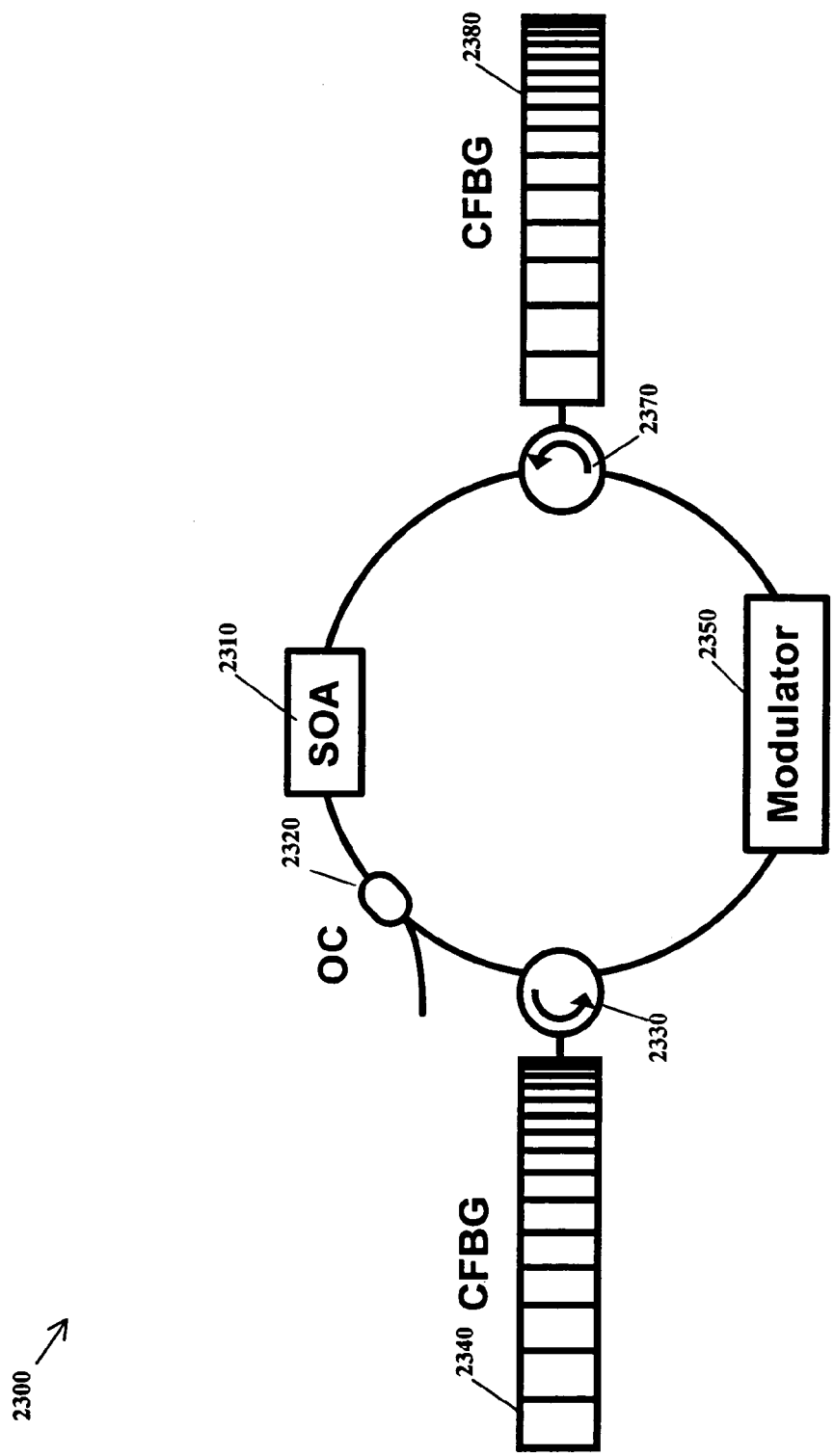
FIG. 23 shows a "Breathing Mode" Mode locked laser (MLL) embodiment with a modulator. The modulator used in FIG. 23 can be a multiple quantum well saturable absorber or a LiNbO3 modulator.

FIG. 23 shows a compact "Breathing Mode" Mode locked laser (MLL) embodiment 2300 with a modulator 2350. The laser is comprised of fiber components such as the SOA 2310, the output coupler 2320, the first optical circulator 2330, first CFBG (stretcher) 2380, the modulator 2350, the second optical circulator 2370, and the second CFBG (compressor) 2340.

Instead of free space bulk diffraction gratings as a pulse stretcher and a pulse compressor (FIG. 24), two CFBGs are put inside cavity to make a laser compact; first CFBG 2380 is a stretcher and second CFBG 2340 is a compressor. The time duration of stretched pulse before SOA 2310 is much longer than energy storage time of SOA 2310. Therefore nonlinearity i.e. self phase modulation which can distort an optical pulse can be reduced and at the same time optical pulse can extract more energy that stored energy inside SOA 2310. After SOA 2310, optical pulse is divided by output coupler 2320. an optical pulse which remains inside cavity is compressed by a CFBG stretcher 2340 and then it goes though a modulator 2350 that has a short gating time. The modulator 2350 can be a passive MQW SA or LiNbO3 intensity modulator.

Dispersion-Managed Breathing Mode-Locked Semiconductor Ring Laser

Figure 24C:
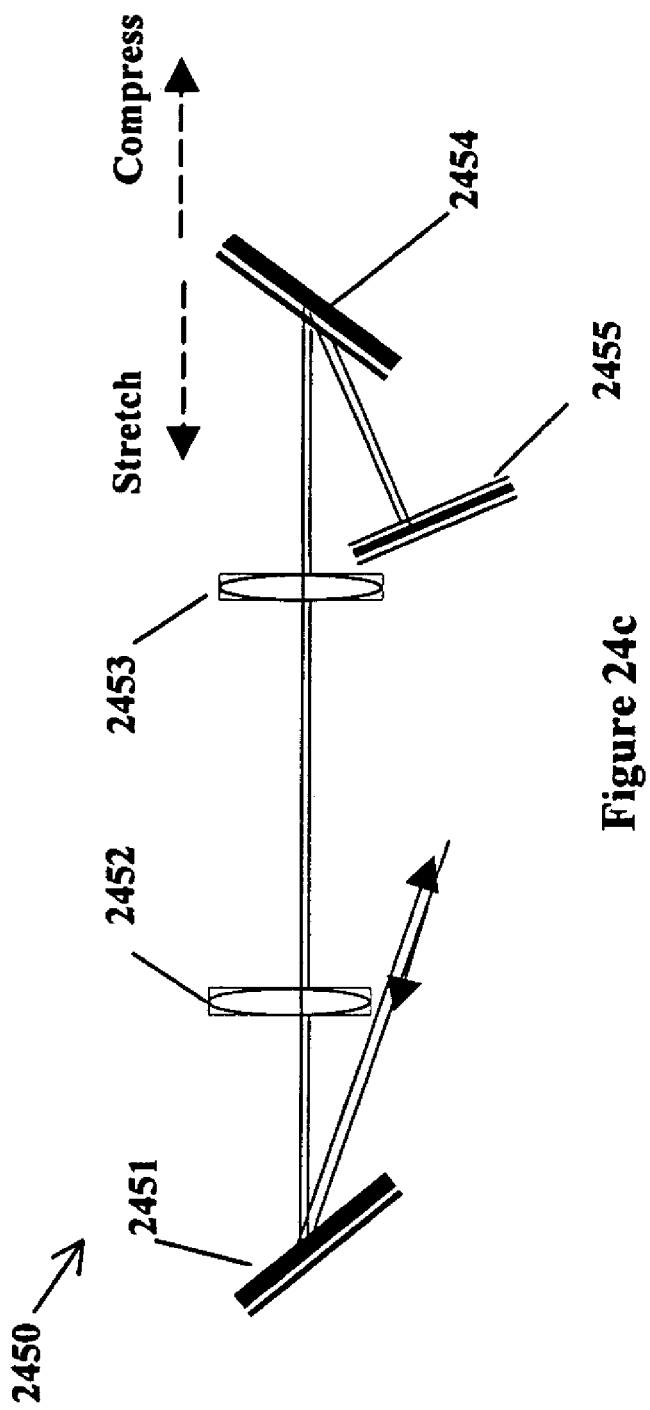
FIG. 24c shows the set-up for the dispersion elements and external compressor.

FIGS. 24a to 24c show an experimental set-up 2400 for the dispersion managed breathing-mode σ-ring cavity diode laser. FIG. 24a shows the mode-locked semiconductor σ-ring cavity 2402. FIG. 24b shows the set-up for diagnostics measurement of spectra and autocorrelations 2404. FIG. 24c shows the setup 2450 used for dispersion element 1 (compressor) 2416, dispersion element 2 (stretcher) 2420, and the external compressor 2435.

The salient feature is the incorporation of the compressor 2416 and stretcher 2420 in the sigma cavity. An optical isolator 2413, such as a commercial product from Electro-Optics Technology with isolation >30 dB, permits light propagation only in the counterclockwise direction inside the cavity. Since the saturable absorber (SA) 2428 is designed for normal incidence, σ-shape ring propagation is managed with an optical circulator comprising half-wave plate 2418, quarter-wave plate 2426, and a polarizing beam-splitter (PBS) 2419. FIG. 24c shows the external compressor 2435, dispersion element 1, 2416, and dispersion element 2, 2420 are standard dual pass grating compressors 2451, 2454, (we used commercial Spectrogon gratings with 1800 lines per mm), with internal telescopes, hence they can operate as pulse compressors or stretchers. The introduced dispersion amounts of those components were controlled by the relative position between gratings. Output ports 2414, 2424 are after the gain medium 2410 and after the SA 2428. Both intracavity diode 2410 and external cavity semiconductor optical amplifier (SOA) 2432 are angle-stripe, approximately 0.5 mm long SOAs. The chirped SA 2428 has multiple quantum wells with thickness of approximately 70/75/80 Å to sustain broad bandwidth saturable absorption. Passive mode locking is established using the SA 2428 and a dc-biased (approximately 190 mA) intracavity SOA 2410. The sigma cavity laser outputs 2415, 2425 are individually directed to a spectrometer 2430, such as a commercial Jarell Ash equipped with a Reticon CCD camera, or to an external SOA 2432 to boost the power prior to the autocorrelator 2436, such as a commercial Femtocrome FR-103.

Figure 25:
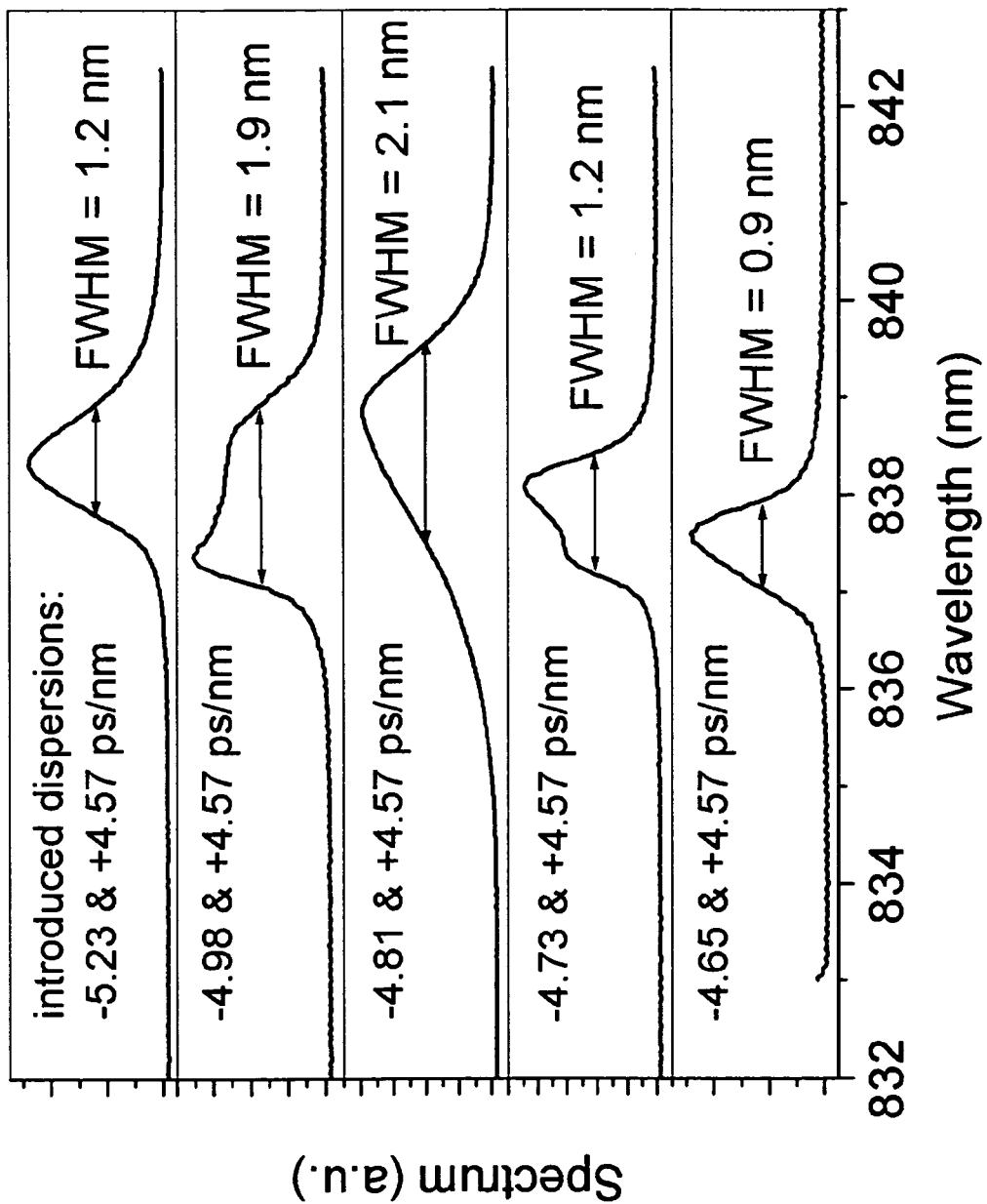
FIG. 25 shows the spectral changes in the laser output after the SA when element 1 introduced dispersion is varied and element 2 introduced dispersion is constant.

The pulse train repetition rate is approximately 1.116 GHz, corresponding to the $31^{st}$ harmonic of the laser cavity. The pulse spectrum after the SA 2428 is recorded from output 2425 while keeping the introduced dispersion by element 2 2420 constant and varying the dispersion introduced by element 1 2416 and is shown in FIG. 25. A fixed dispersion of approximately 4.57 ps/nm is introduced by element 2 2420. In each dispersion element, a 1 cm grating position variation corresponds to an introduced dispersion of approximately 0.83 ps/nm. There is an optimal grating position in element 1 2416, which introduces approximately −0.25 ps/nm additional dispersion than that introduced by element 2 2420. When such optimal dispersion is introduced, the obtained spectrum is the broadest and pulses are compressible to their shortest duration. The optimal total dispersion of approximately −0.25 ps/nm introduced by elements 1 2416 and 2 2420 compensates the dispersion of other cavity elements. Small variations in the total cavity dispersion cause dramatic changes in the spectral shape and width.

Figure 26:
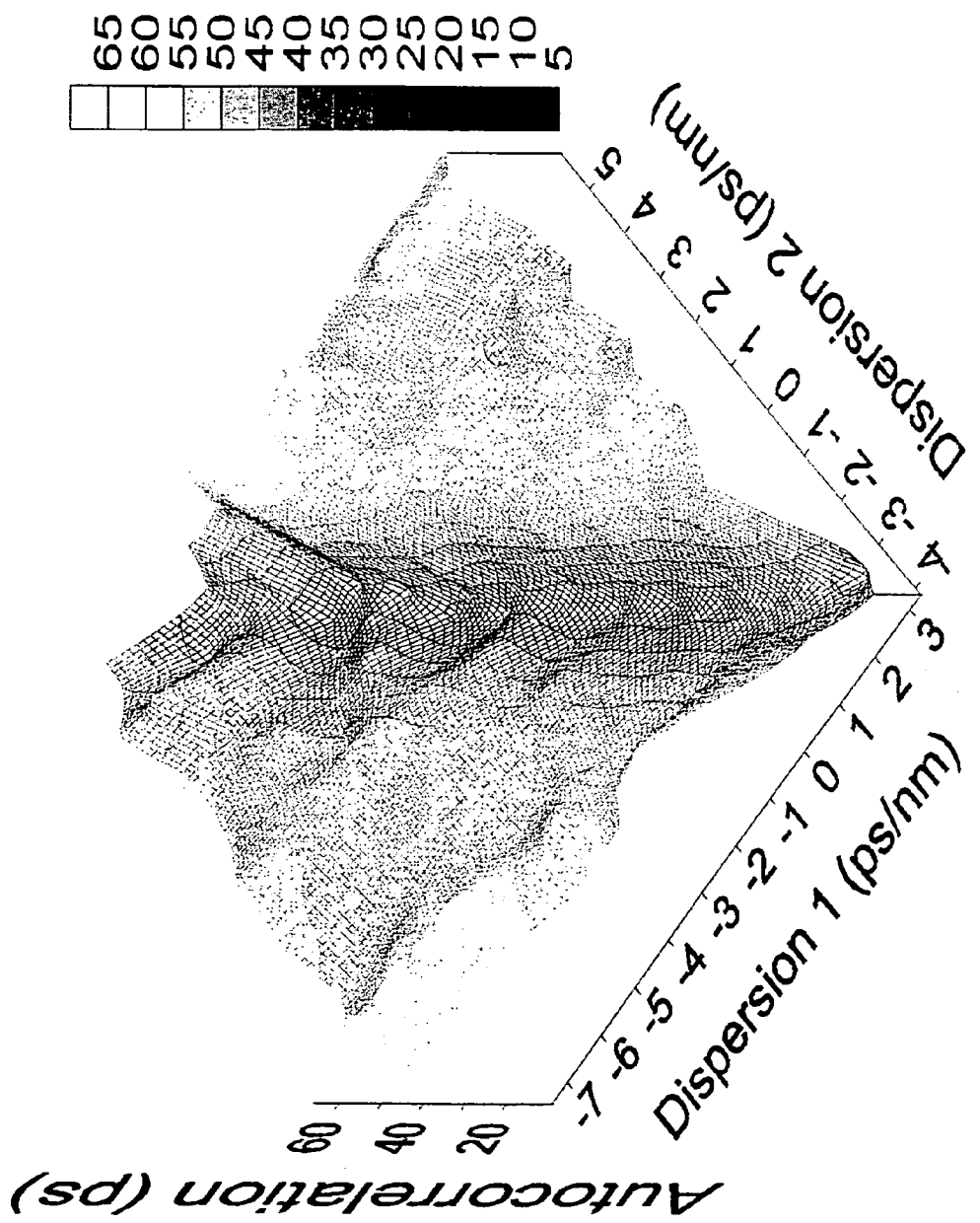

FIG. 26 displays measurements after the gain element 2410 from output 1 2415 of the second harmonic intensity autocorrelation versus dispersion introduced by elements 1

2416 and 2 2420. Data points are collected for movable grating position adjustments of approximately 1 cm yielding approximately 200 data points and the map is obtained by interpolation. On-diagonal map values occur for dispersions of equal magnitude and opposite sign in elements 1 2416 and 2 2420. From the map we can see that when the laser operates in the regime near the diagonal region of the map, output pulses were shorter without coherent spikes. In contrast, noise bursts—temporally broad pulses with coherence spikes—were observed for off-diagonal map values.

Figure 27:
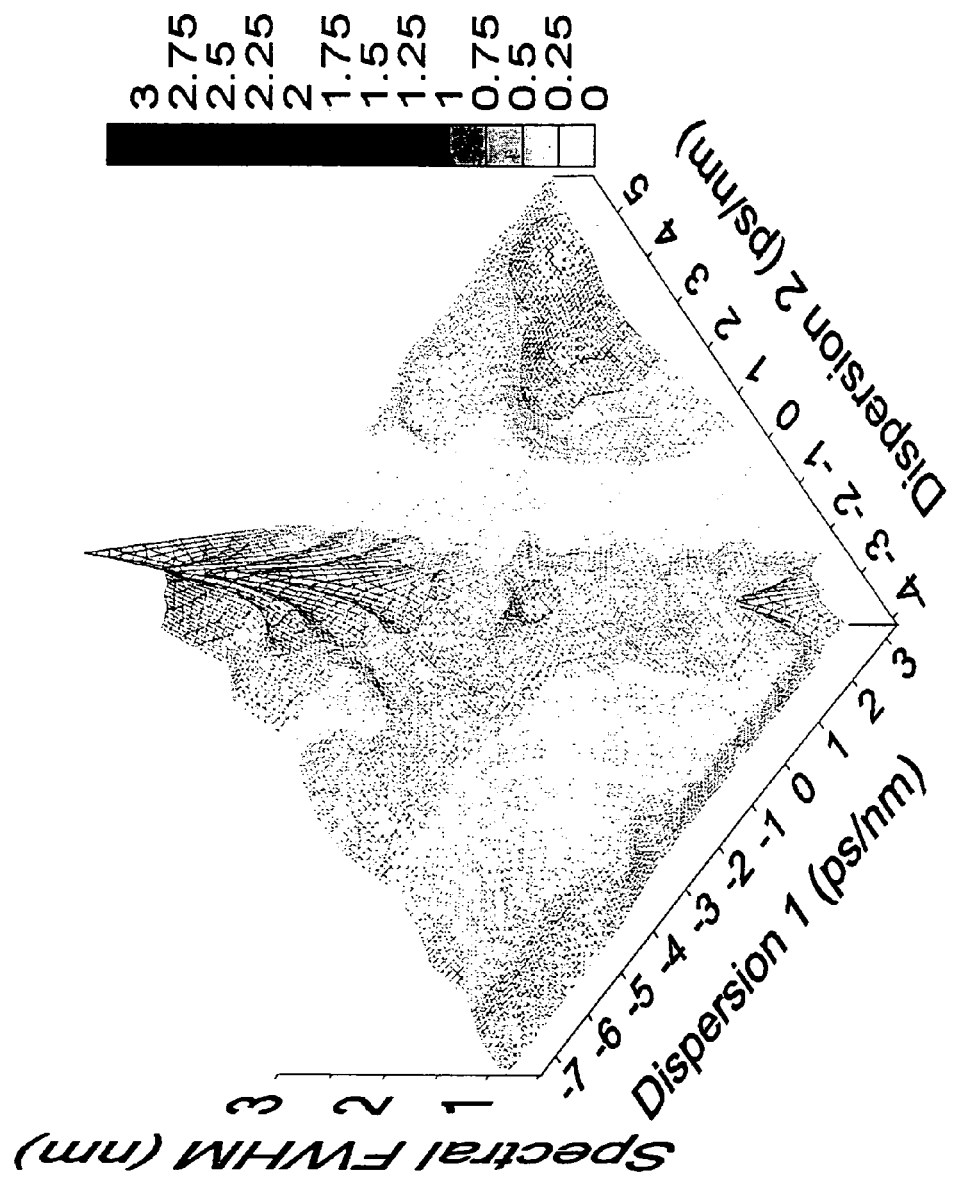
Figure 28:
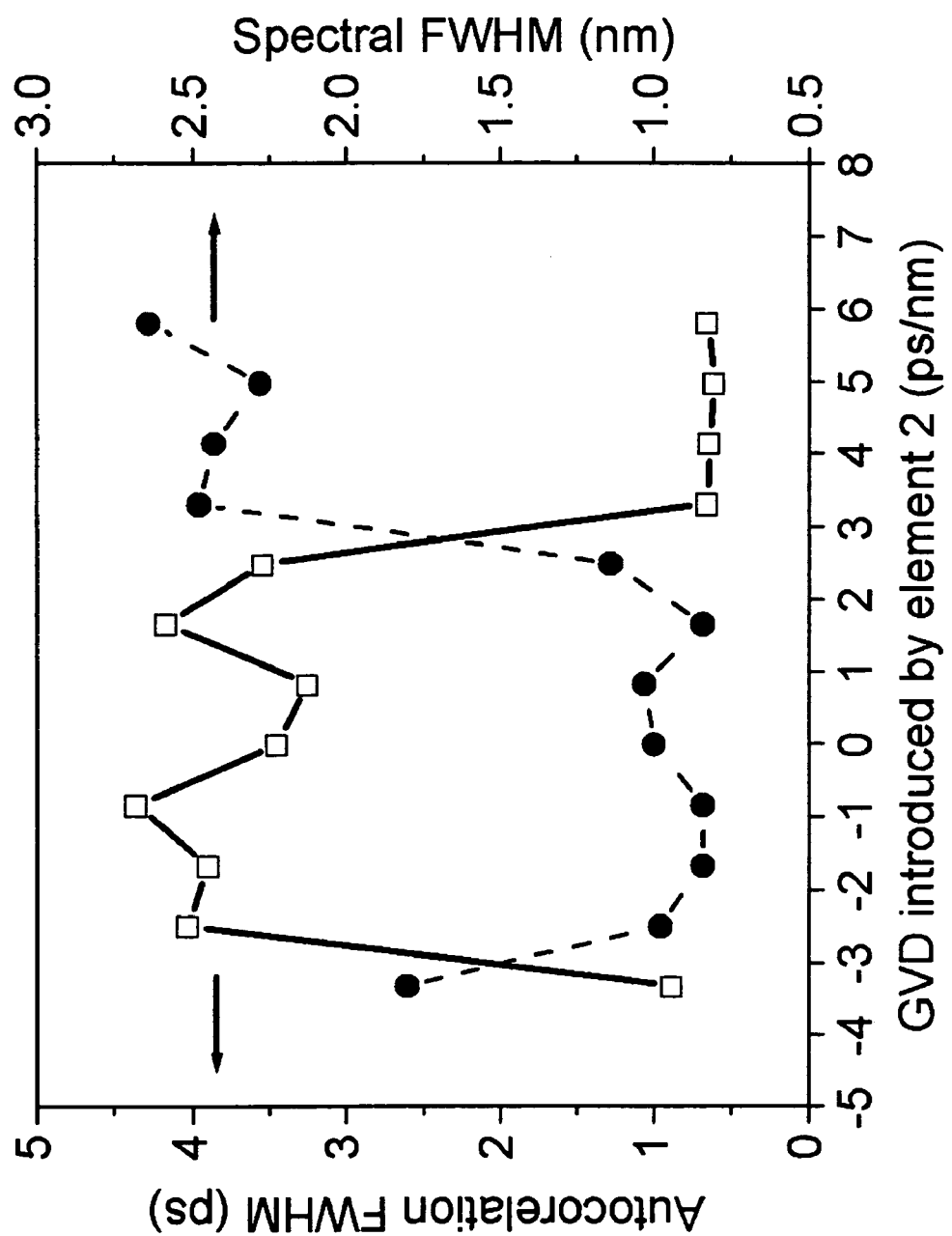
FIG. 28 shows the externally compressed autocorrelation and spectral FWHM vs. element 2 introduced dispersions.
Figure 30:
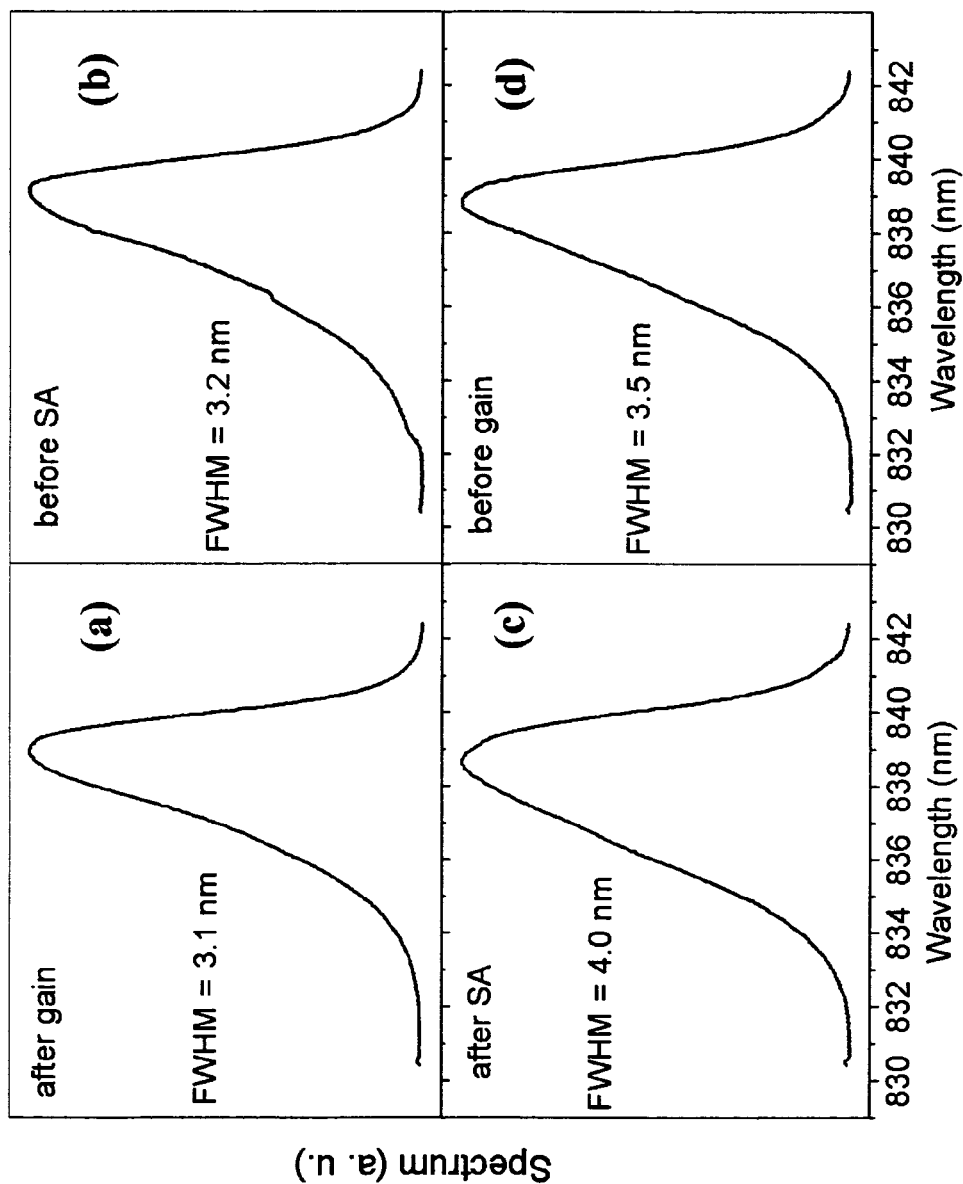

FIG. 27 illustrates similar measurement after the SA 2428 from output 2 2425 of spectral bandwidth (FWHM) versus dispersion in elements 1 2416 and 2 2420. The bandwidth is slightly broader close to the map diagonal. The results along the diagonal of the map are summarized in FIG. 28. Externally compressed pulse autocorrelation and bandwidth are plotted versus dispersion introduced by element 2 2420. A threshold value for the dispersion occurs at approximately −3.3 and approximately +3.3 ps/nm for dispersion elements 1 2416 and 2 2420, respectively. Beyond this threshold, the spectrum broadens more than twice, output pulses are externally compressible below approximately 1 ps and the laser is operating in breathing mode. The breathing mode means that with each cavity round-trip, the pulse is stretched when passing through the gain medium 2410 and compressed when incident on the SA 2428.

FIGS. 29a and 29b show a cross-correlation measurement set-up. FIG. 29a shows a hybridly mode-locked σ-cavity laser 2902 with four outputs 2915, 2922, 2930, 2932, for pulse evolution characterization. FIG. 29b shows the set-up 2904 for measurements of spectra as well as autocorrelation and cross-correlation traces. The intracavity SOA 2910 was biased with approximately 92 mA of DC and a superimposed radio frequency (RF) signal modulated the gain at approximately 323 MHz. Introduced dispersions were approximately −5 ps/nm in the element 1 (compressor) 2916 and approximately +5 ps/nm in element 2 (stretcher) 2930. As depicted in FIG. 29b, the signals from the four different cavity ports 2940 are split after the SOA amplifier 2943 with a 50/50 beam splitter 2946. Half of the beam is guided through the delay line 2950 and then recombined with the other half which passes through the external compressor 2947. The pulse from the cavity is combined with a compressed version of itself, and the autocorrelator 2960 signal reveals the two-pulse autocorrelation trace. The side pulse on the trace represents the cross-correlation of the two versions of the pulse. When the compressed version is much shorter than the original (in this case it is more than approximately 40 times shorter), the cross-correlation trace measures the temporal profile of original pulse intensity.

FIGS. 30a, 30b, 30c, 30d shows the optical power spectra from the four key points of the cavity—after the gain media (intracavity SOA) output 2915, before the SA output 2930, after the SA output 2932, and before entering back to the gain media output 2922. Spectra of the pulse propagating through the laser cavity are similar in shape, with the peak around the same wavelength.

Figure 31:
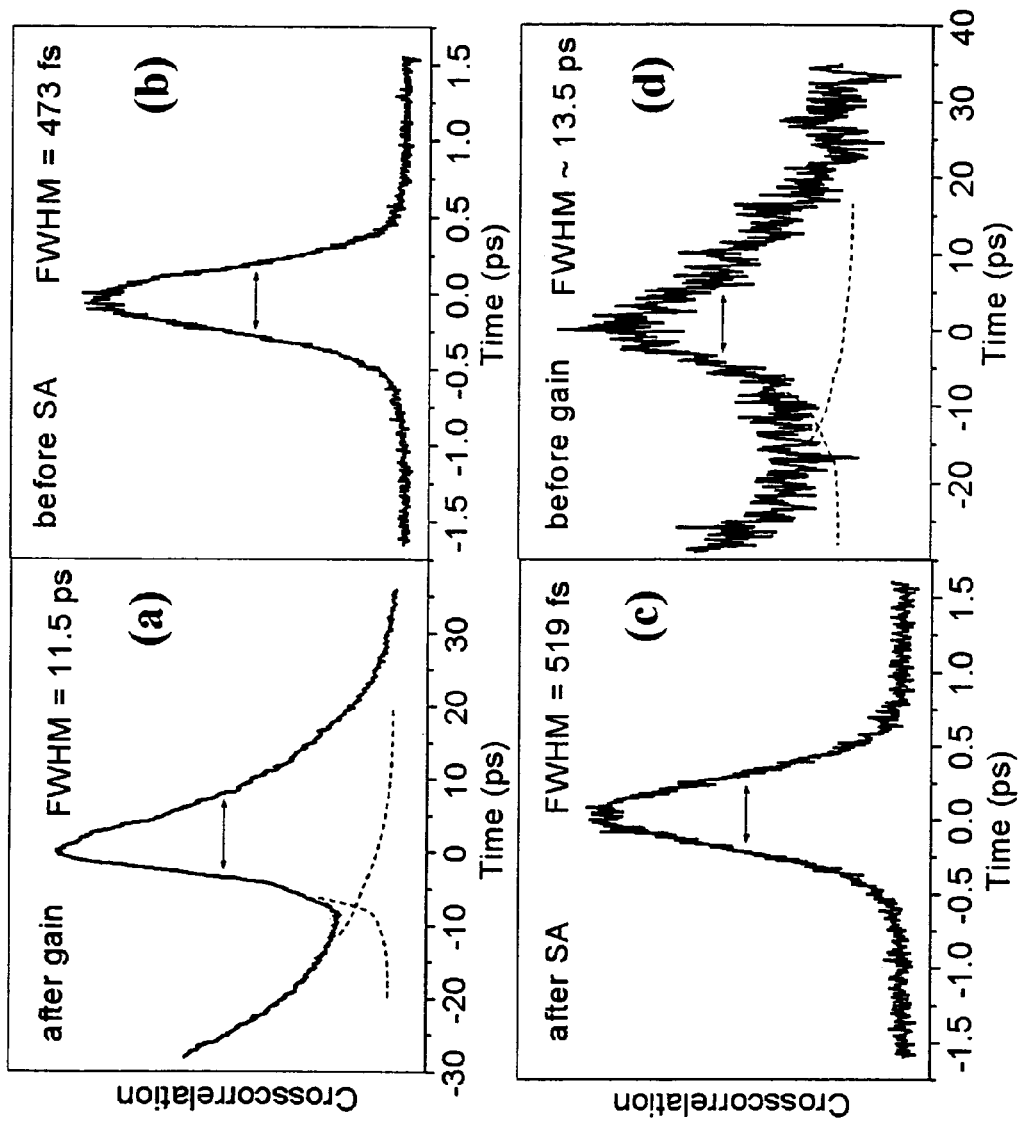

FIGS. 31a, 31b, 31c, 31d shows the cross-correlation traces from the four laser cavity outputs. The stretched pulses exhibit an asymmetric temporal profile with a steep leading edge and a long decaying trailing edge. The stretched pulse traces FIG. 31a and FIG. 31d also contain an artifact from the autocorrelation. The dashed line depicts how the contributions from autocorrelation and the cross-correlation overlap. The cross-correlation traces from before and after the SA in FIG. 31b and FIG. 31c are similar to autocorrelation traces, since those are already short pulses in the cavity and were not externally compressible. The stretched pulse before and after the gain media is more than approximately 20 times broader than compressed one before and after the SA. This measured pulse duration change while propagating in the cavity demonstrates that laser operates in the breathing mode. The pulse energy after the cavity gain media is more than approximately 100 times higher than before the gain media as shown in FIG. 31a and FIG. 31d. This verifies that intracavity chirped pulse amplification was achieved.

Figure 32:
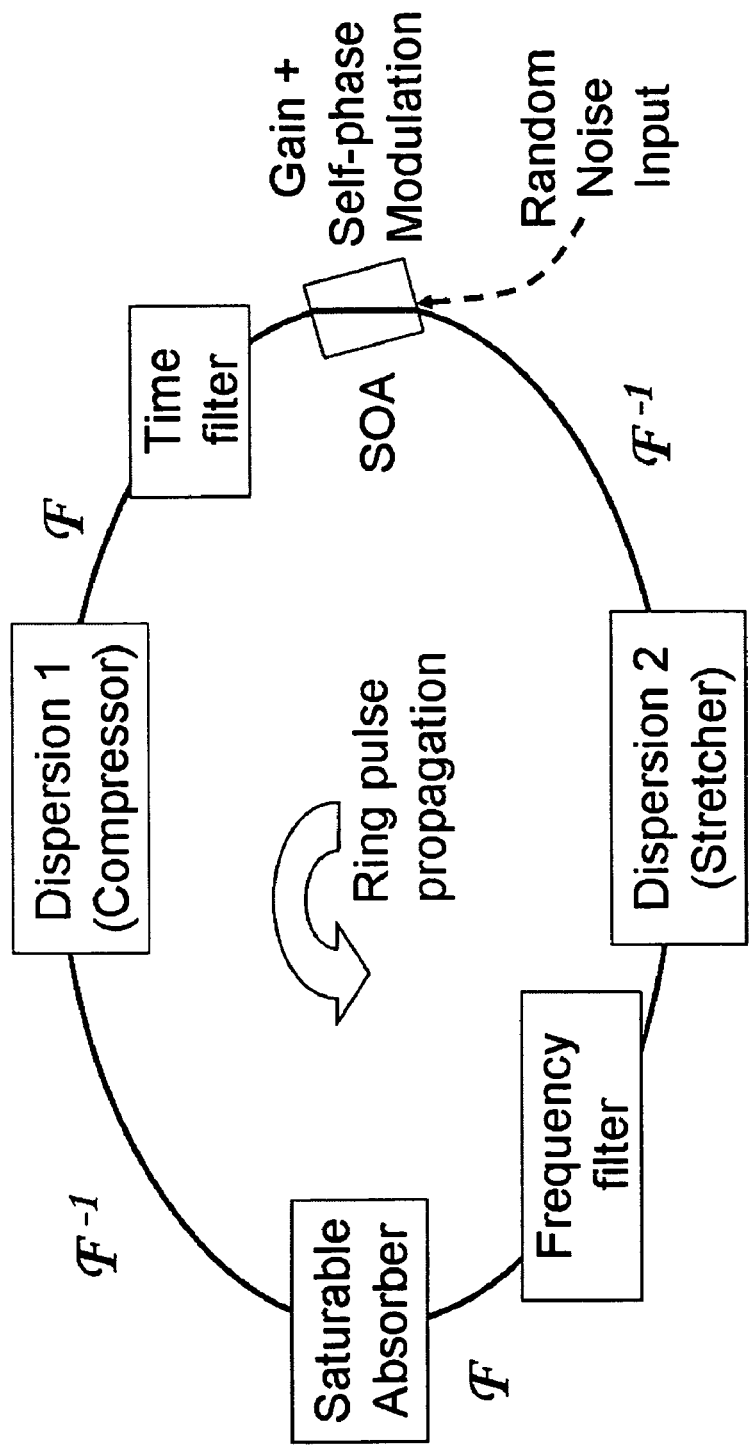
FIG. 32 is a flow diagram representing the algorithm for dispersion-managed mode-locked ring laser simulations.

Dispersion-Managed Breathing Mode-Locked Semiconductor Ring Laser Numerical Simulation FIG. 32 is a flow diagram representing the algorithm to simulate the laser pulse formation from random noise input in the dispersion-managed breathing mode-locked semiconductor ring laser of FIG. 24a. Elements of the Split-Step Fourier algorithm are arranged in an order analogous to the semiconductor ring laser. The constants used in the simulations are listed in the table of FIG. 33. A frequency filter with FWHM equal to approximately 7.6 nm accounts for the finite bandwidth of the SA and the semiconductor gain. A time filter with FWHM equal to approximately 131 ps. represents a RF modulation of the SOA as a gain element. The results from the simulations are scaled to the measured pulse energies after the cavity gain element energy is equal to approximately 33 pJ and after the SA energy is equal to 0.86 pJ. The pulse energy after the gain is approximately 1.64 times larger than the gain saturation energy and the pulse energy after the SA is approximately 2.8 times larger than the saturation energy of the SA.

Figure 34:
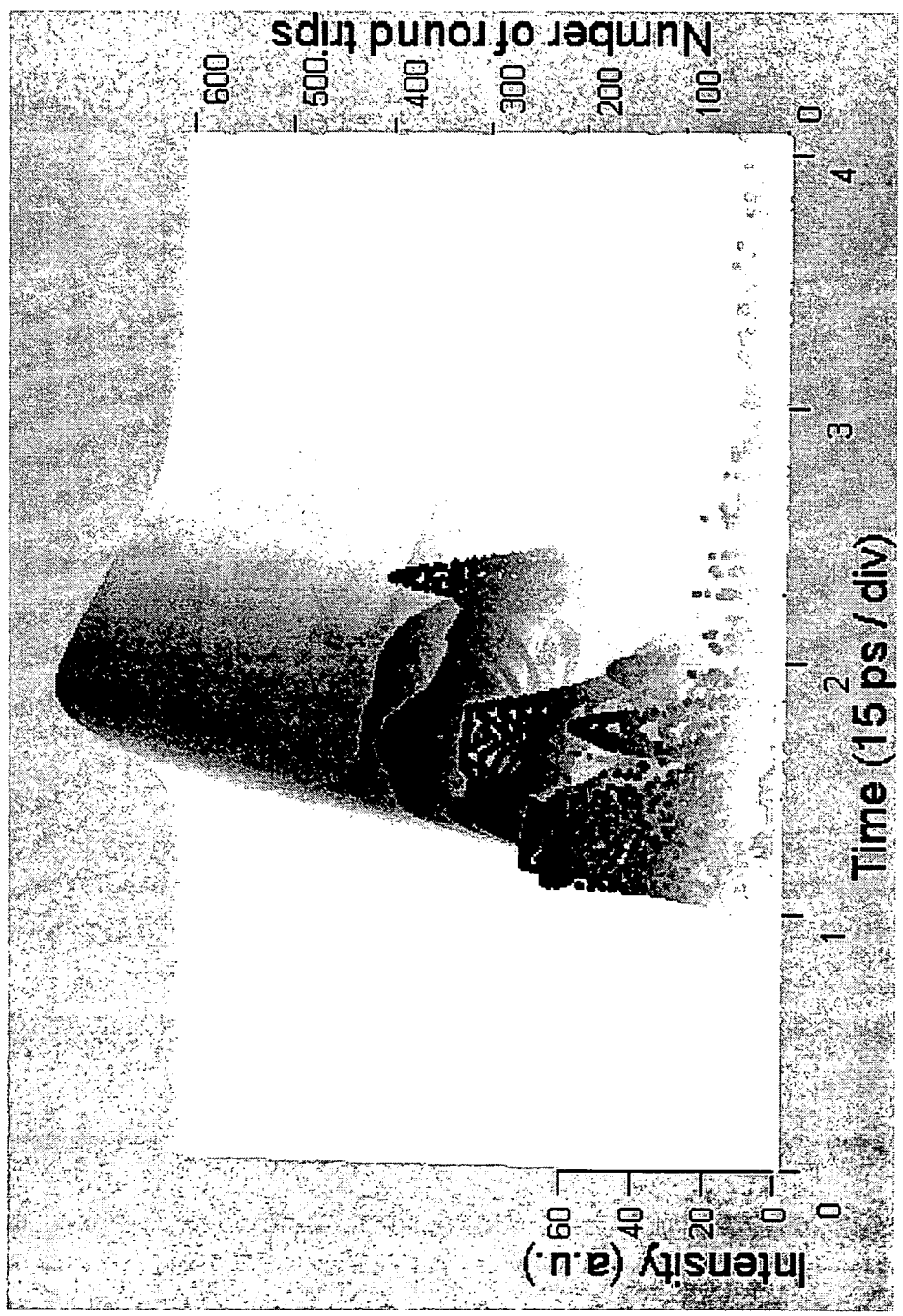
FIG. 34 shows the formation of the stretched pulse after the gain media from random noise input.

The mode-locked stretched pulse formation from input random noise is shown in FIG. 34. The steady-state pulse shape is formed after approximately 350 cavity round trips.

Figure 35:
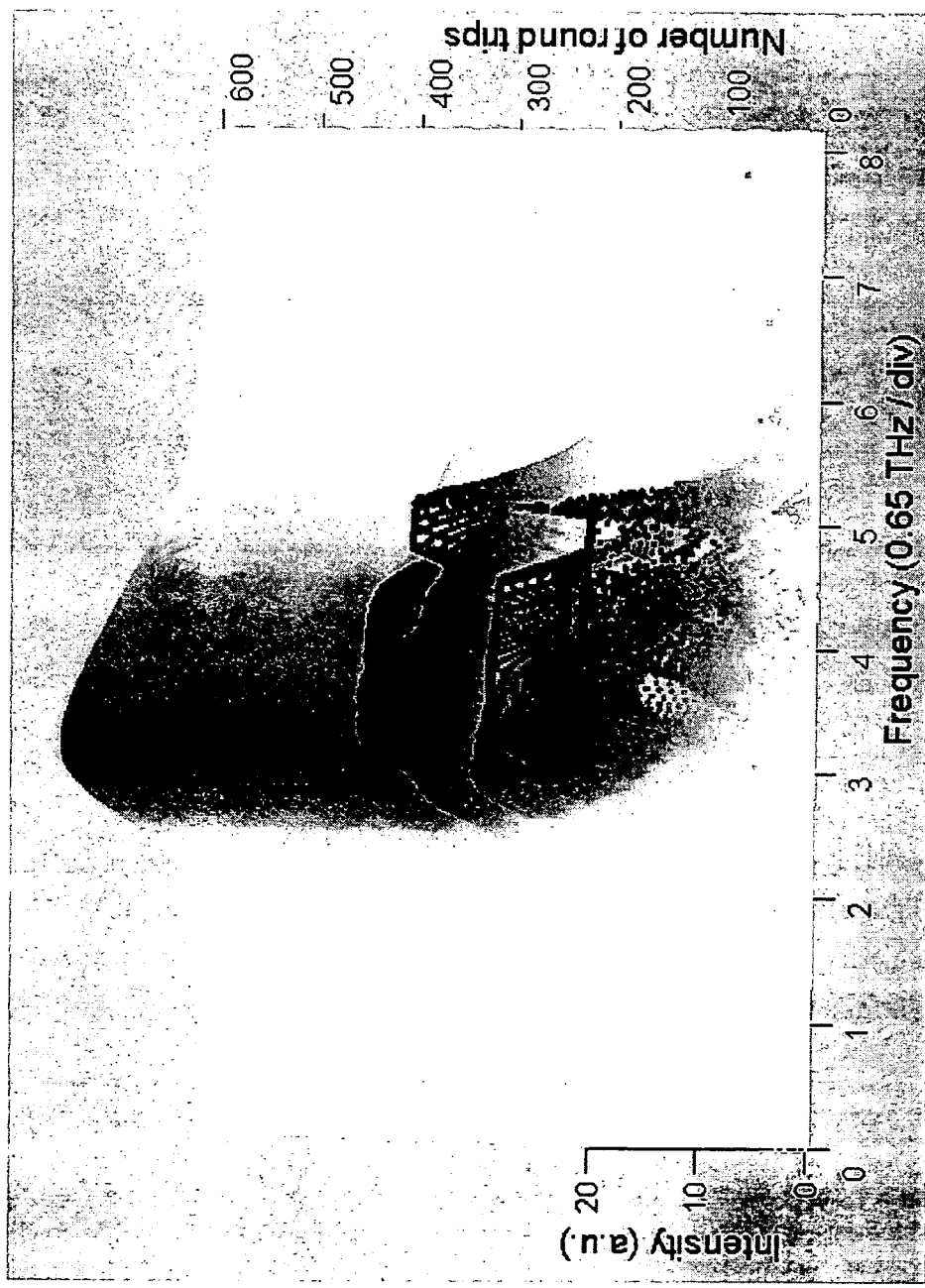
FIG. 35 shows the mode-locked spectrum build-up after the cavity gain element.
Figure 36:
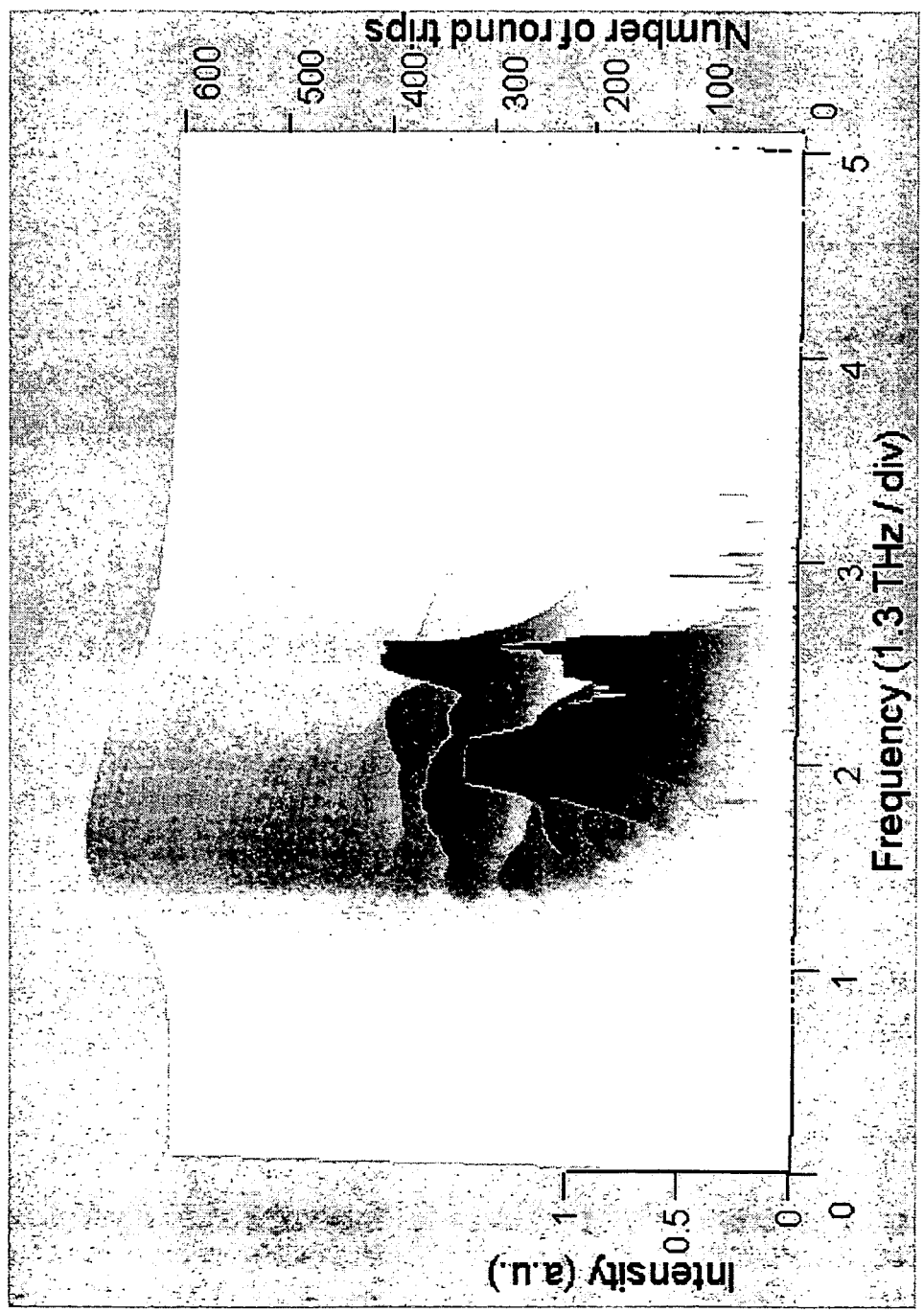
FIG. 36 shows the mode-locked spectrum build-up after the saturable absorber.

FIGS. 35 and 36 show the build-up of the mode-locked spectra after the cavity gain element and after the SA. The steady-state pulse spectral and temporal intensity after approximately 600 simulated cavity round trips are compared with the measured ones as shown in FIGS. 37a, 37b, 37c and 37d. The main part of the simulated stretch pulse fit well as compared to the experimentally measured pulse. The leading part of the cross-correlation trace of FIG. 37c contains an artifact from the middle autocorrelation trace of FIG. 31a which enhances the leading and trailing edge of the pulse measured by the two-pulse autocorrelation technique.

Figure 37:
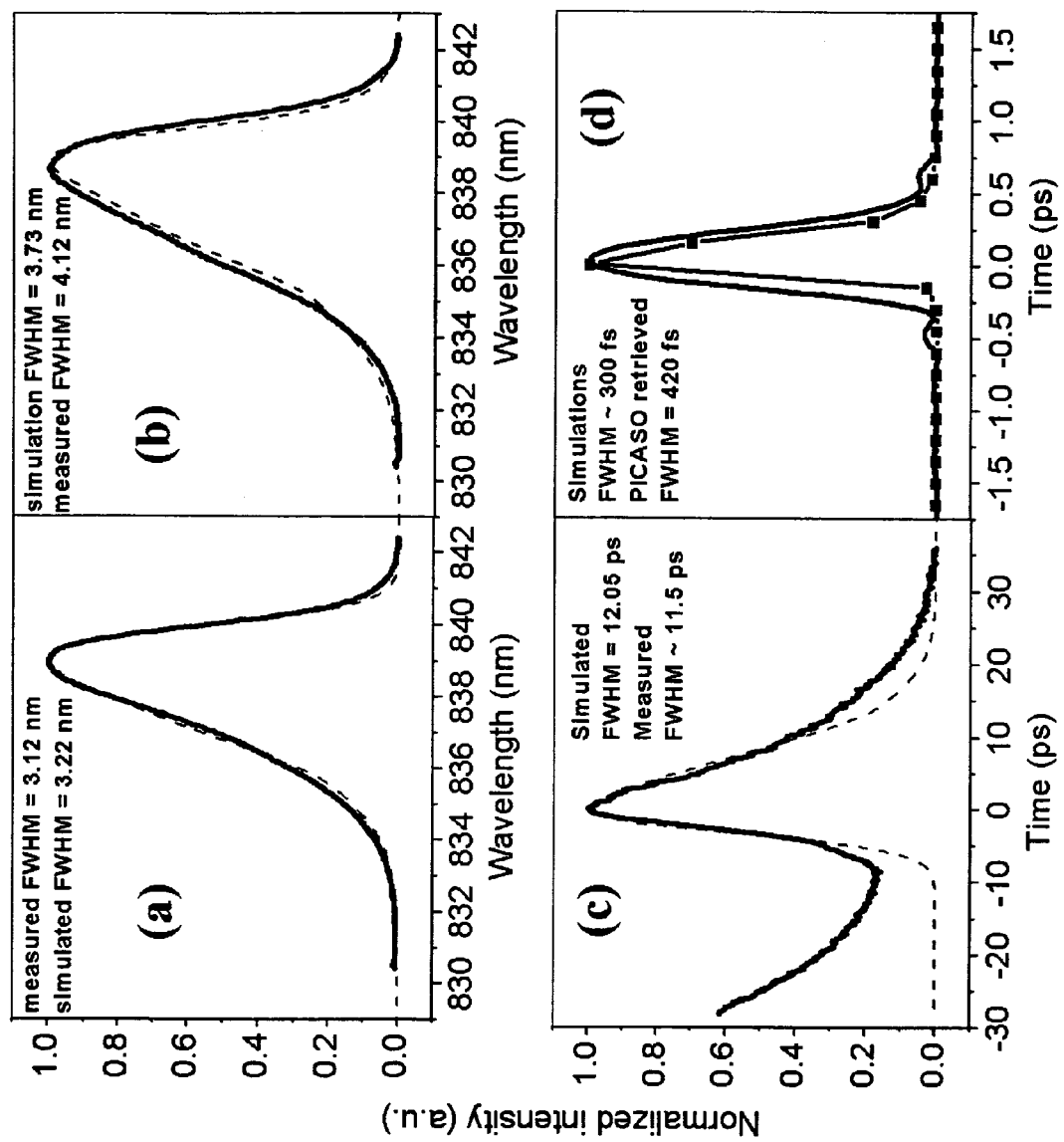
FIG. 37a shows the comparison of simulated and measured stretched pulse spectrum after the gain.
FIG. 37b shows the comparison of simulated and measured compressed pulse spectrum after the saturable absorber.
FIG. 37c shows the comparison of simulated and measured stretched pulse temporal intensity after the gain.
FIG. 37d shows the comparison of simulated and measured compressed pulse temporal intensity after the saturable absorber.

In FIG. 37d the steady-state simulated compressed pulse temporal intensity after the SA is compared with the corresponding pulse retrieved by the PICASO method. The pulse temporal intensity and phase are calculated by use of the PICASO algorithm from the measure spectrum and second-order intensity autocorrelation. Both pulses exhibit the same trend. The difference between the retrieved pulse by PICASO and the pulse obtained through simulation differs by approximately 150 fs. This difference may be due to additional dispersion encountered in the experimental setup prior to the intensity correlation measurements, minor inaccuracies in the PICASO algorithm, or the finite resolution of the temporal grid used in the simulation.

Figure 38:
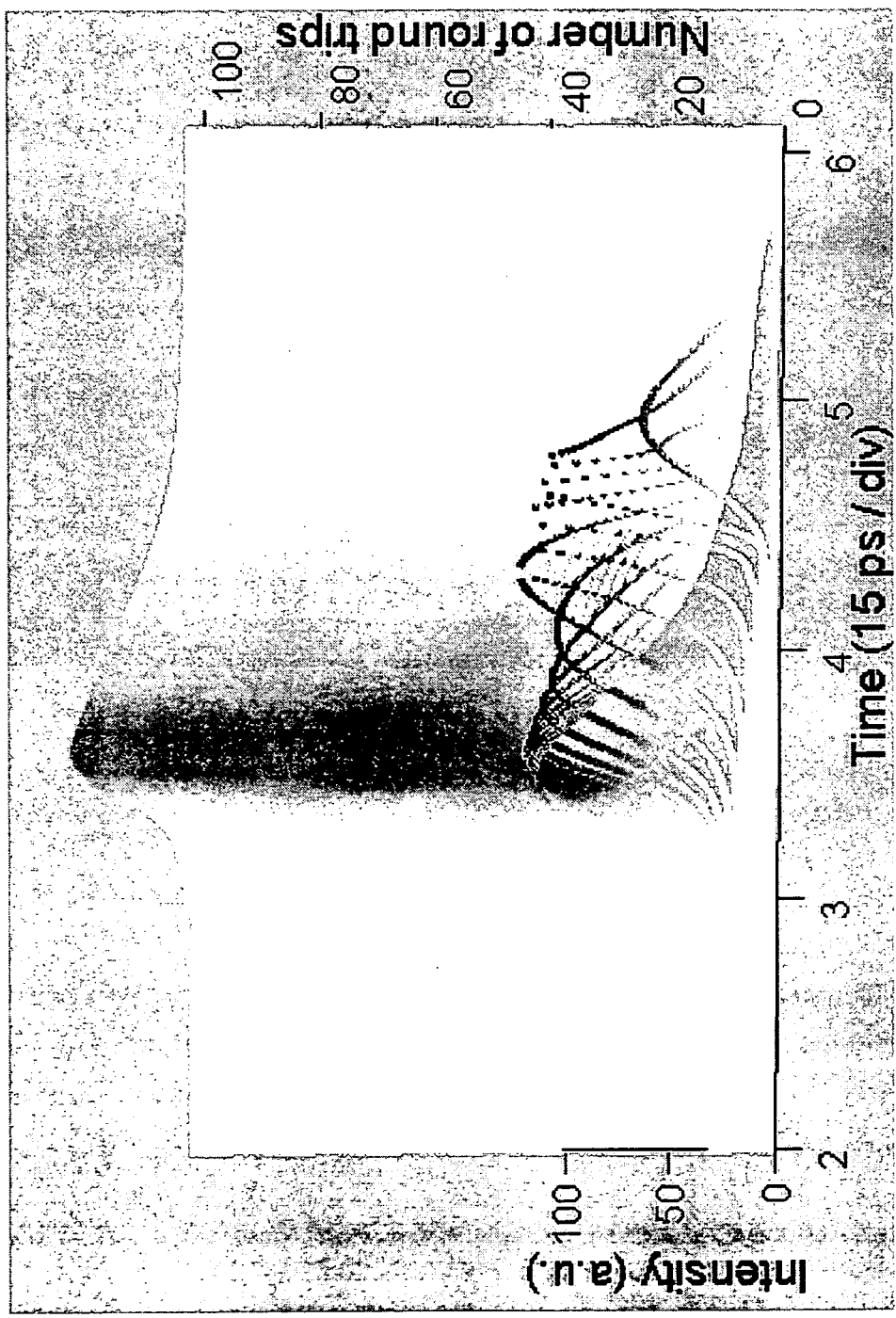
FIG. 38 shows the locking-up of stretched pulses after the gain media to the external-cavity injected Gaussian pulses.

FIG. 38 shows simulation of lock-up of the dispersion-managed breathing-mode semiconductor mode-locked ring laser to externally injected Gaussian pulses. Lock-up is achieved after less than approximately 50 cavity round trips.

Figure 39:
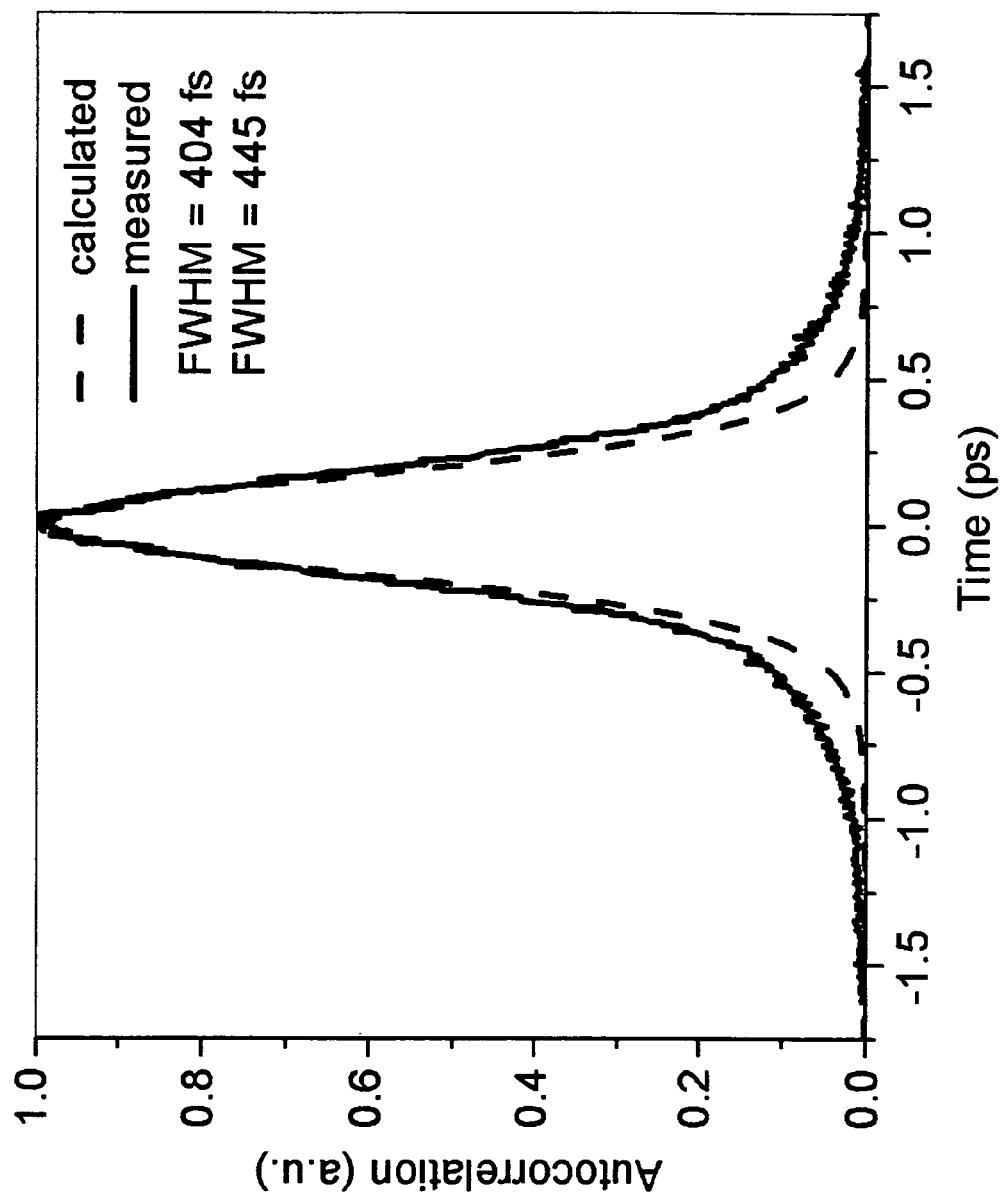
FIG. 39 shows the comparison of the bandwidth-limited calculated and the measured autocorrelations of the externally compressed pulses after the gain media.

FIG. 39 shows a comparison of the measured and the Fourier limited calculated second-harmonic autocorrelation of externally compressed pulses from the experimental set-up of FIG. 29a. The set-up 2904 for measurements of spectra as well as autocorrelation and cross-correlation traces is used without the delay line 2950 in the diagnostics part. Linearly-chirped pulses from the laser output 2915 after the cavity gain media 2910 are compressed using a dual-grating external cavity compressor 2947. The bandwidth-limited autocorrelation is calculated from the measured spectrum of the laser output after the gain element as in (a) of FIG. 30. The calculated autocorrelation FWHM of approximately 404 fs. is only approximately 10% shorter than the measured FWHM of approximately 445 fs. From this, we can conclude that efficient intracavity linear chirping and amplification as well as external cavity amplification and compression are achieved.

Figure 40:
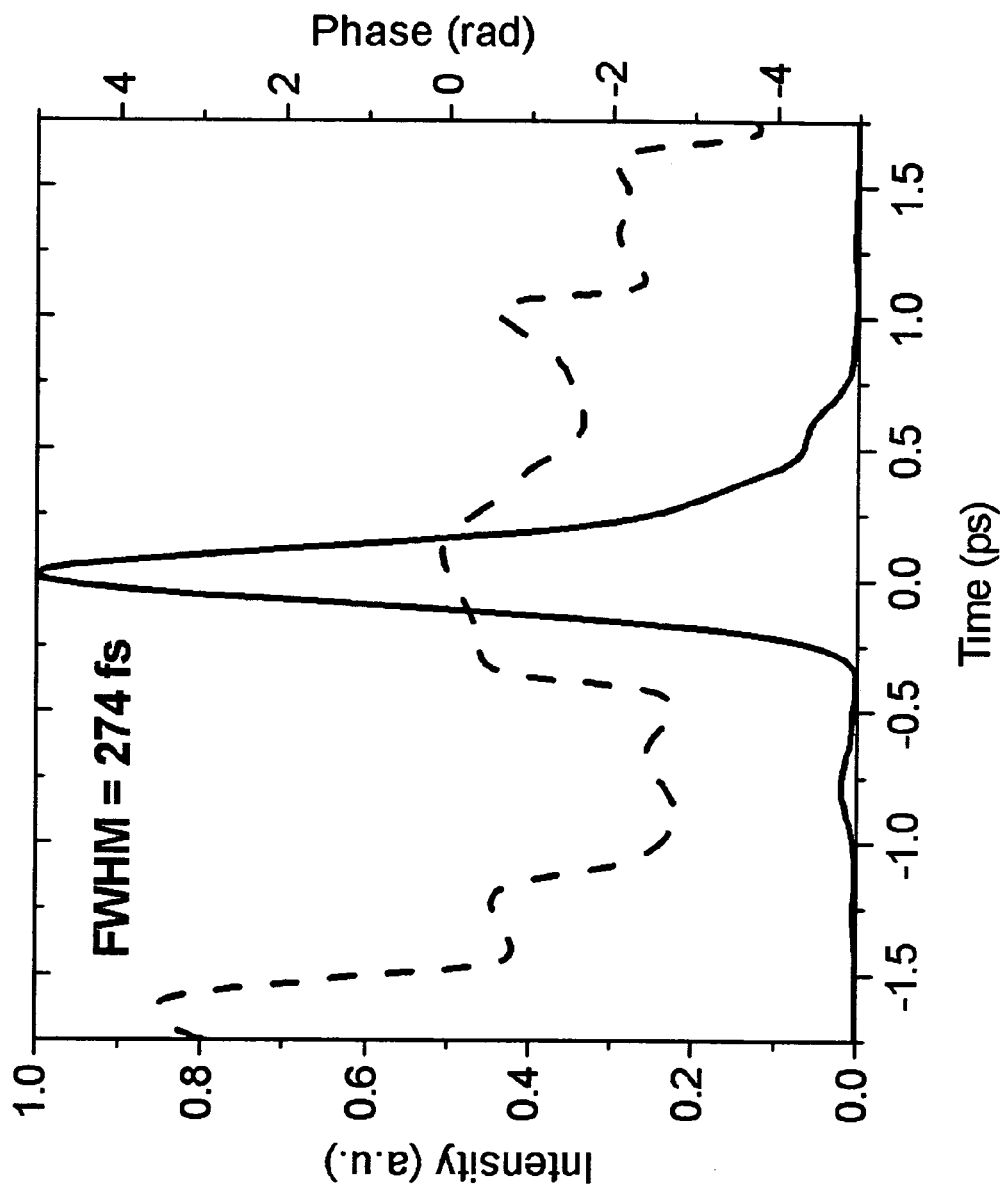
FIG. 40 shows the PICASO retrieved temporal intensity and phase of the externally compressed pulses after the gain media.

FIG. 40 shows the pulse temporal intensity and phase retrieved by the PICASO algorithm. The pulses from the output after the gain medium are externally compressed to FWHM of approximately 274 fs. A measured average amplified power of approximately 6.25 mW after external compression at the repetition rate of approximately 323 MHz would correspond to pulse energy of approximately 19 pJ with peak power approximately 70 W and a focused intensity of approximately 1 $GW/cm^2$.

SHG-FROG Experimental Results

Figures 41A, 41B:
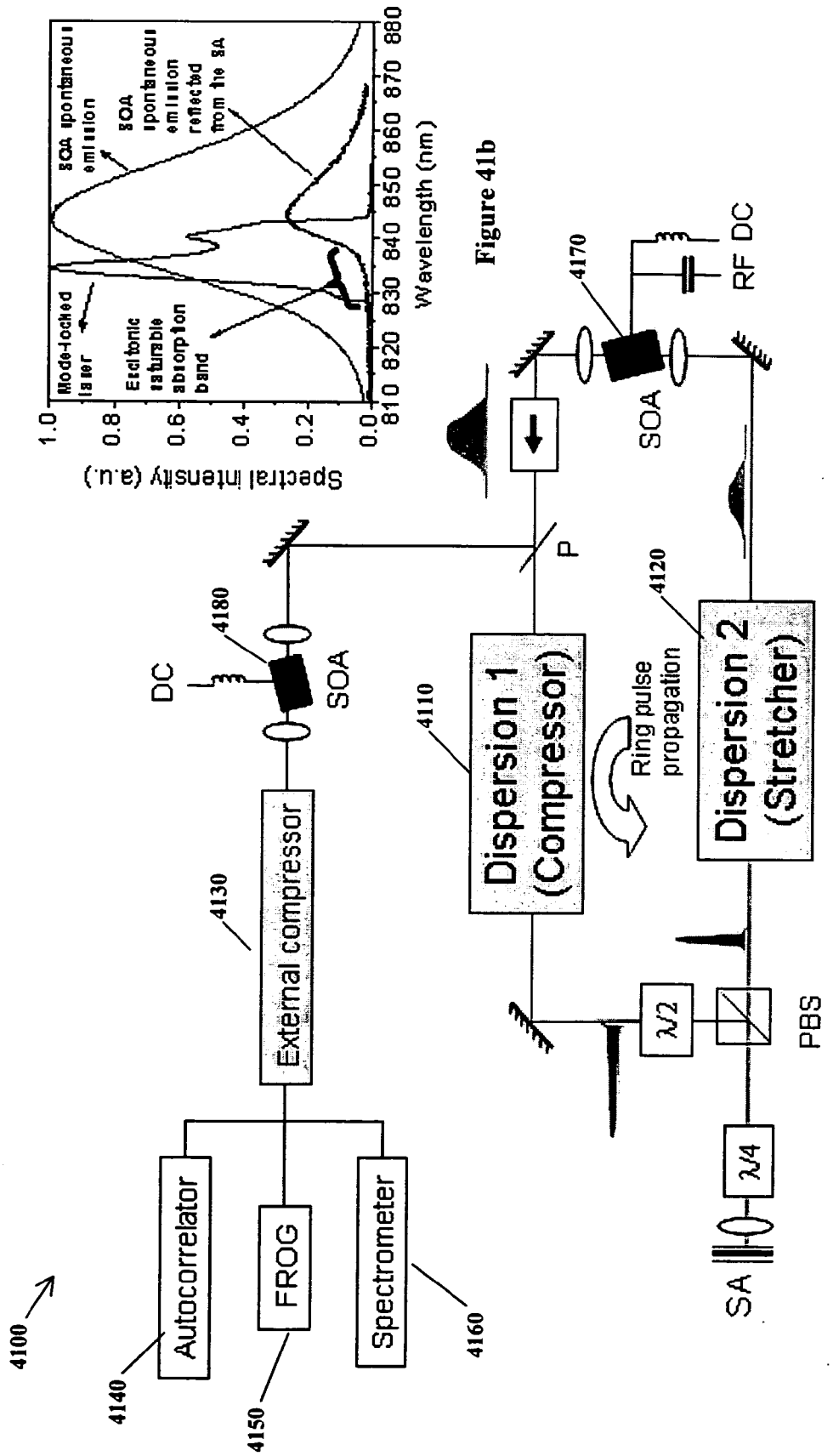
FIG. 41a shows an experimental setup of dispersion-managed breathing-mode semiconductor mode-locked σ-ring cavity laser with diagnostics.
FIG. 41b shows the spectra of the SOA spontaneous emission, the SA excitonic absorption band, and the mode-locked laser.

FIG. 41a shows an experimental setup of dispersion-managed breathing-mode semiconductor mode-locked σ-ring cavity laser with diagnostics. As in the embodiment of FIG. 24a, the salient feature of the laser cavity is the incorporation of dispersion element 1 4110 and dispersion element 2 4120. The elementsl 4110 and 2 4120 as well as the external compressor 4130 are typical dual pass grating compressors with internal telescopes providing tunable positive or negative group velocity dispersion (GVD).

The laser output after the cavity gain element is externally amplified and characterized by a spectrometer 4160, a second-harmonic intensity autocorrelator 4140, and second-harmonic generation frequency-resolved optical grating (SHG-FROG) 4150. Pulse retrieval is performed with commercial software such as Femtosoft Technologies utilizing a standard SHG-FROG set-up.

The SOAs 4170, 4180 used have a gain peak that is red shifted with respect to the excitonic saturable absorption band. The mode-locked spectrum is located between the gain peak and excitonic absorption band as shown in FIG. 41b. In this wavelength configuration, for up-chirped pulses the red spectral part of the pulse is strongly amplified. Since for up-chirped pulses the red part of the pulse arrives first to the SOA 4170, due to gain depletion the leading (red) part is strongly amplified in temporal domain. The combination of these temporal and spectral effects tends to amplify only the red portion of the pulse and therefore limits the mode-locked spectral width. The laser output spectrum was no broader than approximately 4 nm for the up-chirped pulses. For down-chirped pulses the amplification in the spectral and temporal domain can be balanced. The red part of the pulse is strongly amplified due to red shifted gain peak, but the blue part of the pulse is first incident to the SOA 4170 and is amplified more before the SOA 4170 gain depletes. It should be noted that up chirping would be preferable if the SOA 4170 gain peak is blue shifted with respect to the excitonic absorption peak.

Figures 42A, 42B:
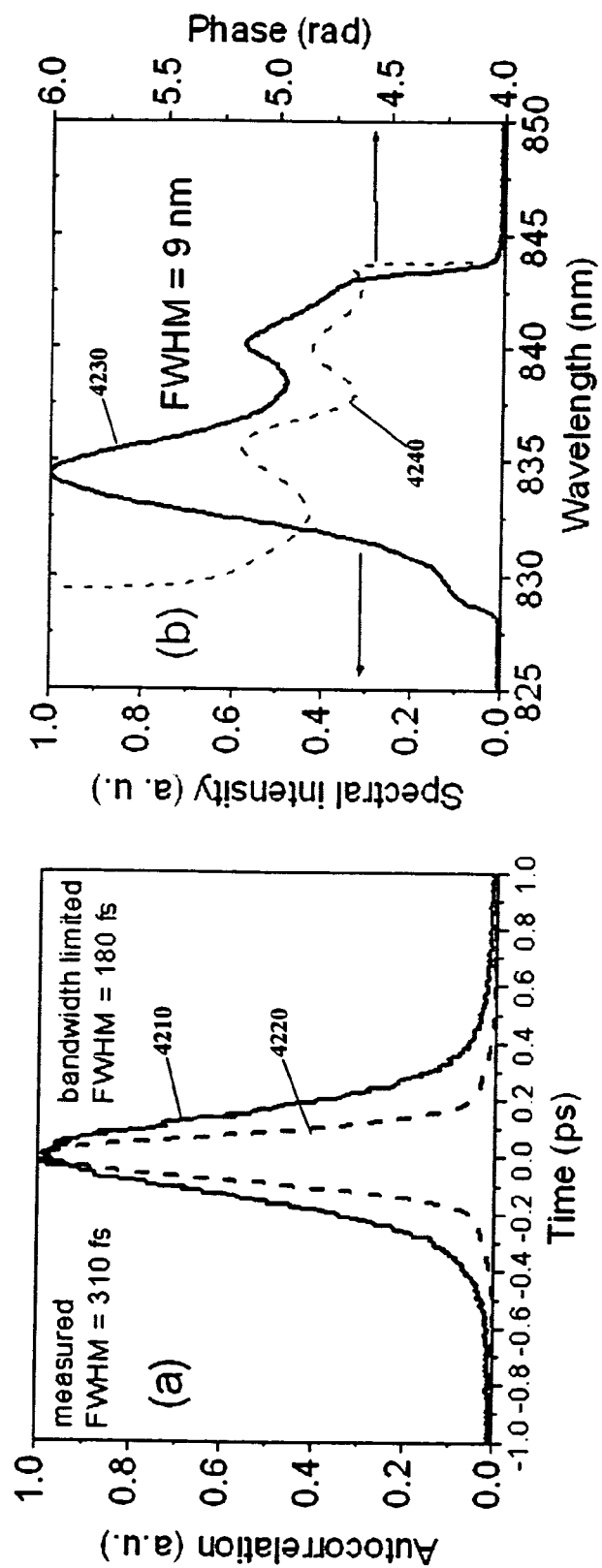
FIG. 42a shows the comparison of measured and calculated bandwidth limited pulse autocorrelation.
FIG. 42b shows the measured pulse spectrum with SGH-FROG retrieved spectral phase.

FIGS. 42a and 42b show the measured laser output after external cavity amplification and compression. As displayed in FIG. 42a, the measured autocorrelation 4210 of FWHM equal to approximately 310 fs, is 1.7 times wider than the bandwidth limited autocorrelation 4220, calculated from the measured spectrum shown in FIG. 42b. FIG. 42b additionally shows the broadened pulse spectrum 4230 of FWHM equal to approximately 9 nm using down chirping along with the corresponding SHG-FROG retrieved spectral phase 4240.

Figure 43B:
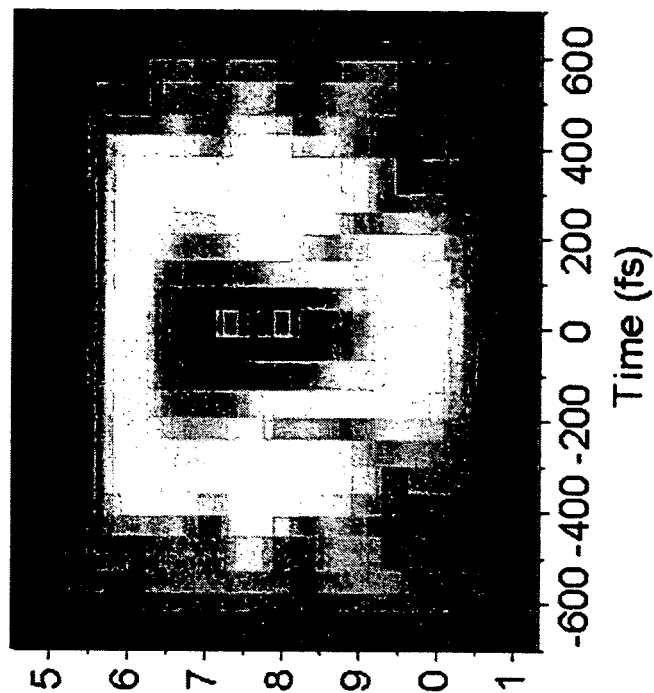
FIG. 43b shows the SHG-FROG retrieved trace.
Figure 43A:
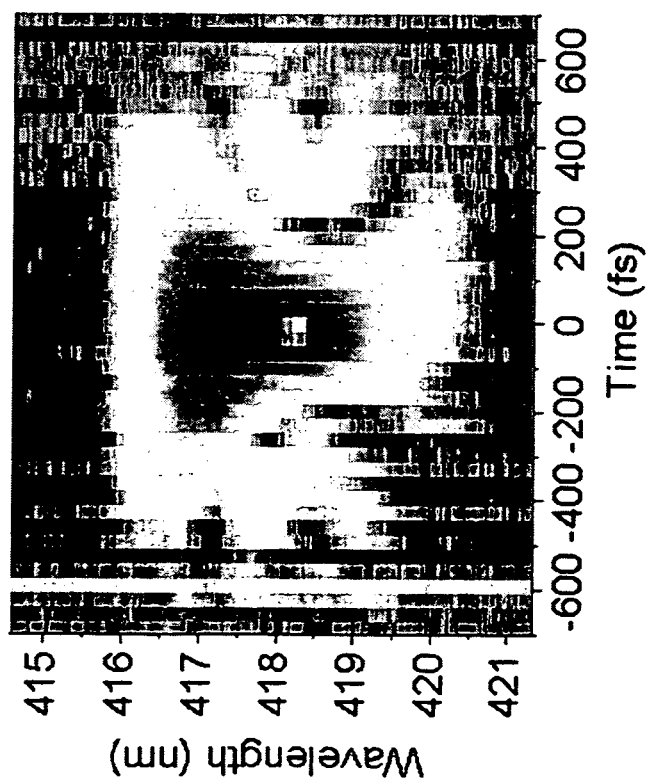
FIG. 43a shows the SHG-FROG experimentally measured trace.
Figure 44:
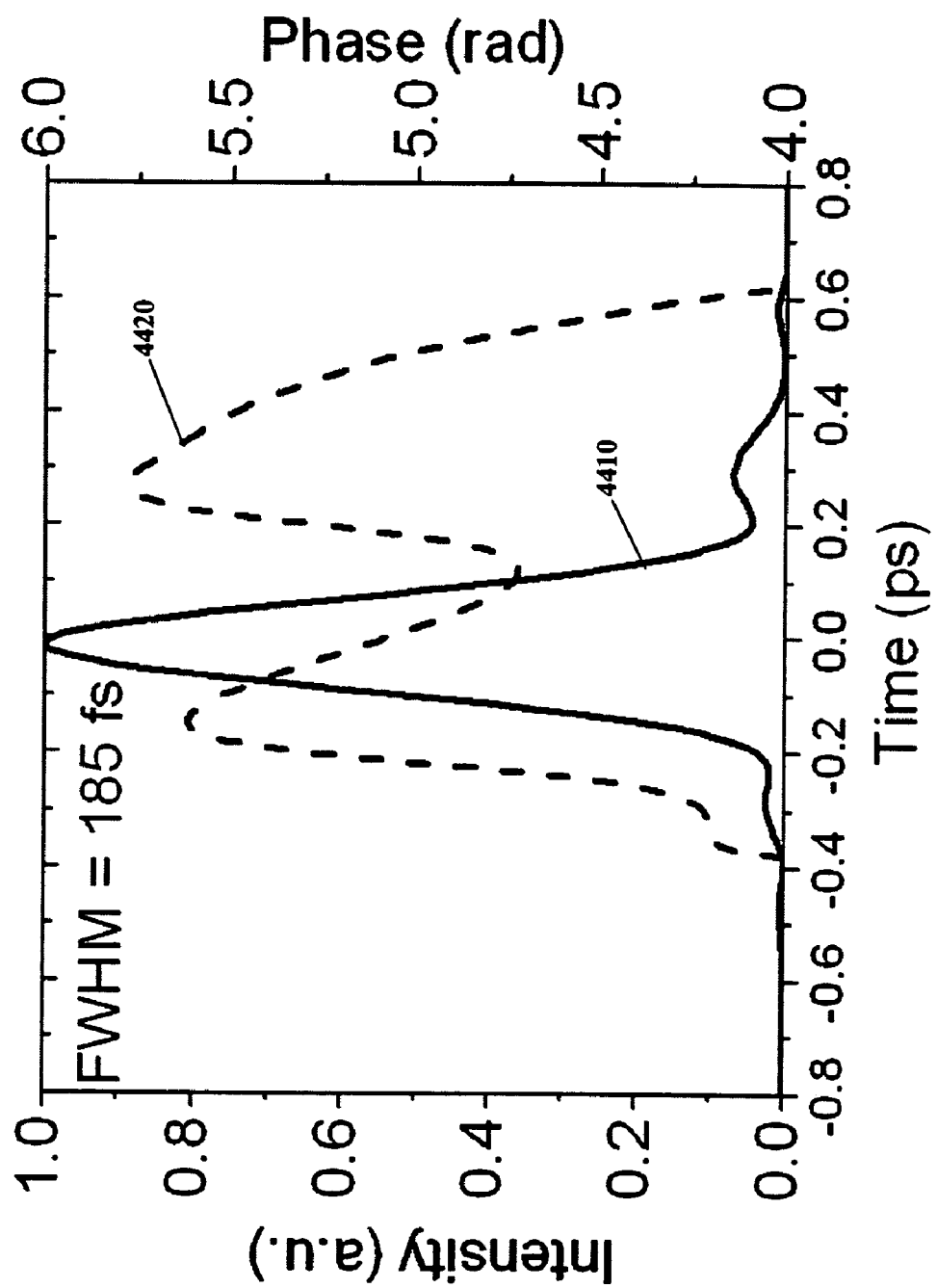
FIG. 44 shows the SHG-FROG retrieved pulse temporal intensity.

FIG. 43a shows the SHG-FROG experimentally measured trace and FIG. 43b shows the SHG-FROG retrieved trace. This demonstrates that the retrieved trace recovers the salient features observed in the experimentally generated trace. The extracted temporal intensity profile along with corresponding phase plots are shown in FIG. 44. The retrieved pulse FWHM is approximately 185 fs.

The invention encompasses a wide body of disciplines ranging from astrophysics to nuclear physics with applications ranging from communications to medical surgery.

The invention has applications in the medical sciences. The X-CPA laser becomes a very accurate scalpel in the performance of femtosecond precision surgery. Ultra-short pulsed lasers allow for non-thermal laser tissue interaction and small collateral tissue damage as compared to longer-pulsed lasers. Cutting by photo-disruption produces much less damage to surrounding tissues than photo-ablation. Intra-ocular microsurgery can ablate or vaporize tissue without creating large "shock waves" that can damage surrounding healthy tissue.

The invention has application in surgery such as ophthalmic surgery, photo-refractive surgery, glaucoma treatment, and corneal refractive surgery to correct refractive problems such as nearsightedness and astigmatism. Surgical procedures such as laser channel cuts for intra-corneal ring segment (ICRS) implantation, femtosecond lamellar keratoplasty (FLK), and intrastromal vision correction, that rely on ultra-short pulsed lasers, are in development. Additionally, the invention can be used for photodynamic therapy of various carcinomas, for hard tissue ablation in dental procedures, and for multiple surgical procedures that have heretofore been performed with a surgical scalpel or a longer-pulsed laser.

The invention can be used for high-speed diagnostic applications such as multi-photon imaging, optical coherence tomography (OCT), and terahertz imaging. The invention can be used to measure optical-matter phenomena in condensed matter materials, to measure very fast events, processes, mechanisms, interactions, and the like.

Such applications are useful not only for medical diagnosis, but also in the study of chemical reactions at the atomic and molecular level.

The invention has applications in the material sciences. Ultra-short pulsed lasers can be used for material processing by way of non-thermal ablation and deposition of materials.

The invention has applications for commercial information networks, along with military and aerospace optical signal processing systems. In communications, the invention can be used as a high-speed transmitter of optical data in fiber optic networks.

In computers, the invention can be used as a transmitter of optical data, as high speed processors of optical data, and as high speed switches of optical data, and the like.

Additionally the invention can be used in the communication through free space.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method of generating ultrashort optical pulses having increased optical power, comprising the steps of:
   generating optical pulses from a source;
   stretching duration of each of the optical pulses to be greater than energy storage time of an optical amplifier;
   amplifying the stretched optical pulse with the optical amplifier; and
   compressing the optical pulse, wherein optical power of the compressed optical pulse is increased.

2. The method of claim 1, wherein the increased optical power is increased at least approximately 100 times.

3. The method of claim 1, wherein the optical pulses include: chirped pulses.

4. The method of claim 3, wherein the chirped pulses include: linear chirped pulses.

5. The method of claim 1, wherein the method step includes the step of: providing a mode locked laser source.

6. The method of claim 5, wherein the mode locked laser source includes: a gain-flattened mode-locked laser source.

7. The method of claim 1, wherein the optical amplifier includes: a semiconductor optical amplifier.

8. The method of claim 7, wherein the semiconductor optical amplifier includes a grating coupled surface emitting optical amplifier.

9. A method of increasing power in optical pulses, comprising the steps of:
   generating optical pulses from a source;
   increasing the temporal duration of the optical pulses to be greater than the storage time of an amplifying medium connected to the optical pulses; and
   amplifying the optical pulses by the amplifying medium, wherein power in the generated optical pulses in substantially increased.

10. The method of claim 9, wherein the optical pulses are chirped pulses.

11. The method of claim 10, wherein the chirped pulses are linear chirped pulses.

12. The method of claim 9, wherein the generating step includes the step of:
   providing a mode locked laser source.

13. An extreme chirped pulse amplifier (XCPA), comprising:
   means for generating optical pulses;
   means for stretching temporal duration of the optical pulses to be greater than storage time of an amplifying medium;
   means for amplifying by the amplifying medium the stretched optical pulses; and
   means for compressing the stretched optical pulse, wherein higher power optical pulses are generated.

14. The laser of claim 13, wherein the generating means includes: a mode locked laser source.

15. The laser of claim 14, wherein the generating means includes: a gain-flattened mode-locked laser source.

16. The laser of claim 13, wherein the stretching means includes:
   a chirped fiber Bragg grating.

17. The laser of claim 13, wherein the compressing means includes: a chirped fiber Bragg grating.

18. A method of generating a highly precise high frequency timing signal, comprising the steps of:
   generating optical pulses from a source;
   stretching duration of each of the optical pulses to be greater than energy storage time of an optical amplifier;
   amplifying the stretched optical pulse with the optical amplifier;
   compressing the optical pulse; and
   coupling the optical pulse to an output, wherein the optical pulse is provided as a timing signal.

19. The method of claim 18, wherein the optical pulses include: linear chirped pulses.

20. The method of claim 18, wherein the method step includes the step of: providing a gain-flattened mode locked laser source.

21. An extreme chirped pulse amplification (XCPA) laser oscillator, comprising:
   a means for generating optical pulses;
   means for stretching temporal duration of the optical pulses to be greater than storage time of an amplifying medium;
   means for amplifying by amplifying medium the stretched optical pulses;
   means for compressing the stretched optical pulses; and
   means for coupling optical pulses to an output, wherein high frequency high precision optical pulses are provided.

22. The laser of claim 21, wherein the generating means includes: a gain-flattened mode-locked laser source.

23. The laser of claim 21, wherein the stretching means includes:
   a chirped fiber Bragg grating.

24. The laser of claim 21, wherein the compressing means includes: a chirped fiber Bragg grating.

25. A method of generating ultrashort optical pulses having increased optical power, comprising the steps of:
   generating optical pulses with high optical energy and a linear chirp;
   stretching the duration of each optical pulse to be greater than the energy storage time of an optical amplifier;
   amplifying the stretched optical pulse with said optical amplifier;
   compressing the optical pulse, wherein the optical power of compressed optical pulse is increased.

26. The method of claim 25, wherein the method step includes modulating the optical pulse whereby the optical pulse is further shortened.

27. The method of claim 26, wherein the modulating step comprises an active modulator such as a LiNbO3 modulator.

28. The method of claim 26, wherein the modulating step comprises a passive modulator such as a multiple quantum well saturable absorber.

29. The method of claim 25, wherein the method step includes the step of: routing the compressed optical pulse back to the generating step.

30. The method of claim 29, wherein the method step includes the step of: output coupling the compressed optical pulse.

31. The method of claim 30, wherein the output coupling includes a: fiber coupler.

* * * * *